(12) United States Patent
Yamazaki et al.

(10) Patent No.: US 7,611,930 B2
(45) Date of Patent: Nov. 3, 2009

(54) METHOD OF MANUFACTURING DISPLAY DEVICE

(75) Inventors: Shunpei Yamazaki, Tokyo (JP);
Sachiaki Teduka, Kanagawa (JP);
Makoto Furuno, Kanagawa (JP);
Satoshi Toriumi, Kanagawa (JP);
Yasuhiro Jinbo, Kanagawa (JP); Koji Dairiki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/186,001

(22) Filed: Aug. 5, 2008

(65) Prior Publication Data
US 2009/0047758 A1 Feb. 19, 2009

(51) Int. Cl.
*H01L 21/84* (2006.01)
(52) U.S. Cl. ............... 438/151; 438/479; 257/E21.561
(58) Field of Classification Search ............ 438/30, 438/151–166, 479; 257/E21.561
See application file for complete search history.

(56) References Cited

U.S. PATENT DOCUMENTS 4,727,044 A * 2/1988 Yamazaki ............... 438/166
5,571,578 A 11/1996 Kaji et al.
5,582,880 A 12/1996 Mochizuki et al.
5,591,987 A 1/1997 Yamazaki et al.
7,115,902 B1 10/2006 Yamazaki

FOREIGN PATENT DOCUMENTS

| JP | 04-242724 | 8/1992 |
| JP | 05-275346 | 10/1993 |
| JP | 07-094749 | 4/1995 |
| JP | 07-211708 | 8/1995 |
| JP | 2005-49832 | 2/2005 |

* cited by examiner

*Primary Examiner*—Richard A. Booth
(74) *Attorney, Agent, or Firm*—Nixon Peabody LLP; Jeffrey L. Costellia

(57) ABSTRACT

In a case of forming a bottom-gate thin film transistor, a step of forming a microcrystalline semiconductor film over a gate insulating film by a plasma CVD method, and a step of forming an amorphous semiconductor film over the microcrystalline semiconductor film are performed. In the step of forming the microcrystalline semiconductor film, the pressure in the reaction chamber is set at or below $10^{-5}$ Pa once, the substrate temperature is set in the range of 120° C. to 220° C., plasma is generated by introducing hydrogen and a silicon gas, hydrogen plasma is made to act on a reaction product formed on a surface of the gate insulating film to perform removal while performing film formation. Moreover, the plasma is generated by applying a first high-frequency electric power of an HF band a second high-frequency electric power of a VHF band superimposed on each other.

22 Claims, 18 Drawing Sheets

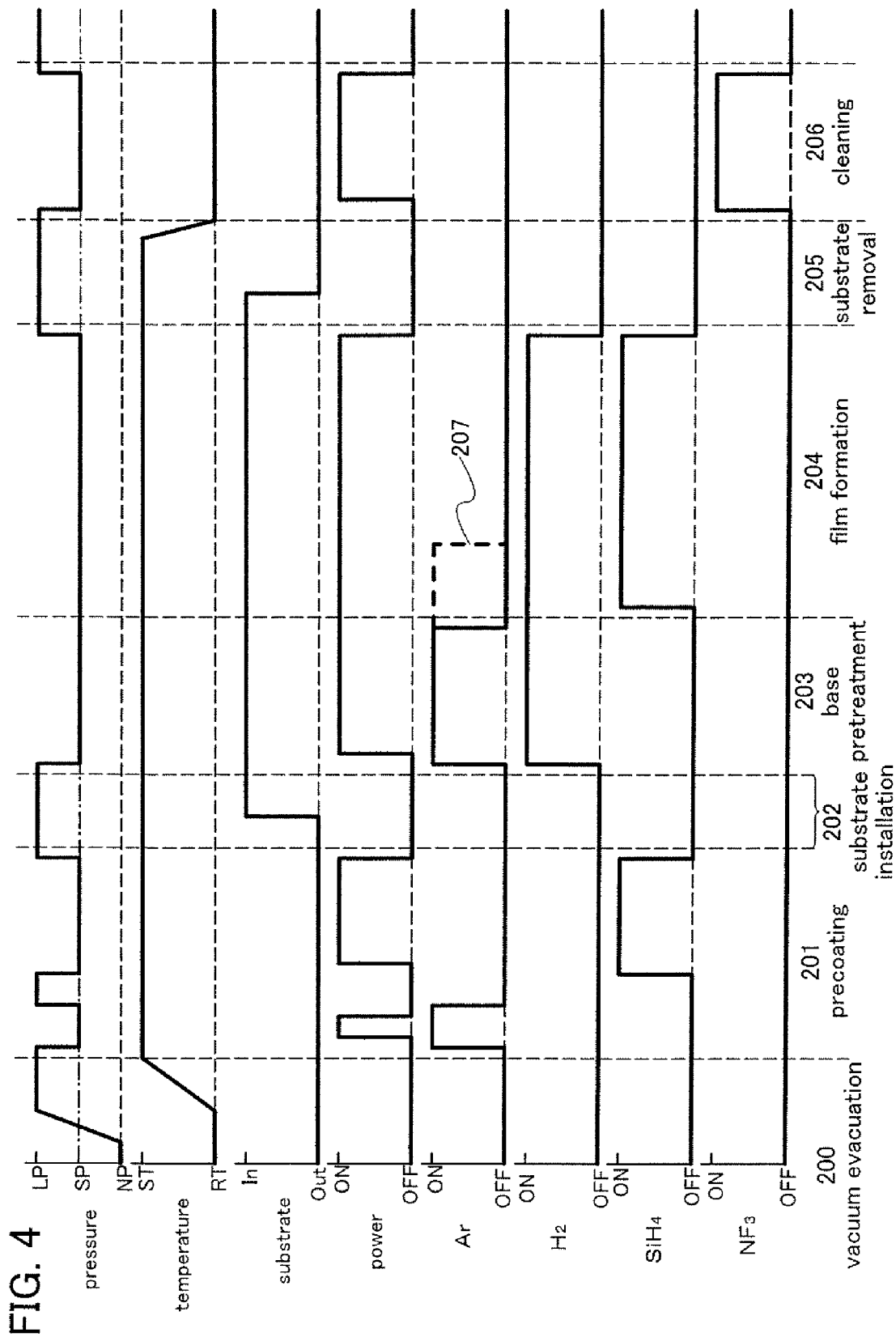

101

105

106a
106b

FIG. 13A
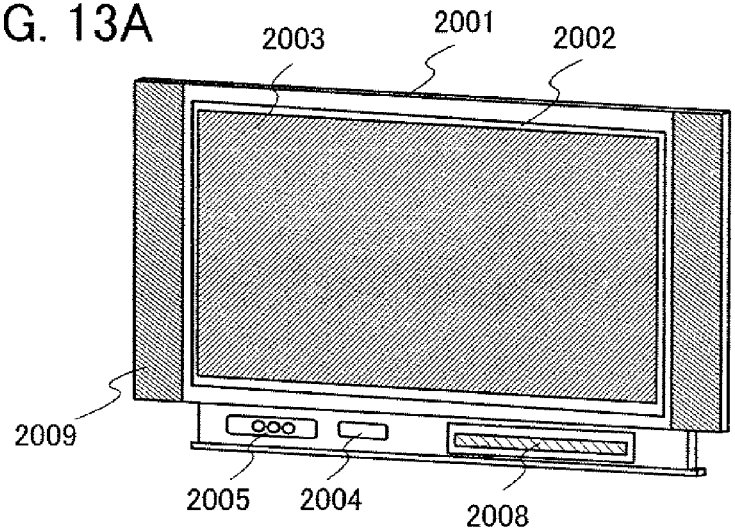
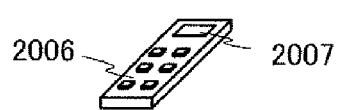
FIG. 13B
FIG. 13C
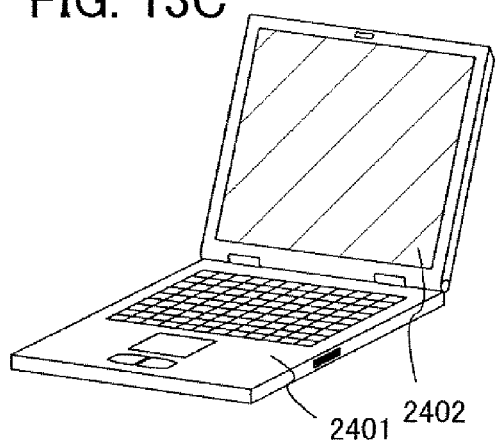
FIG. 13D
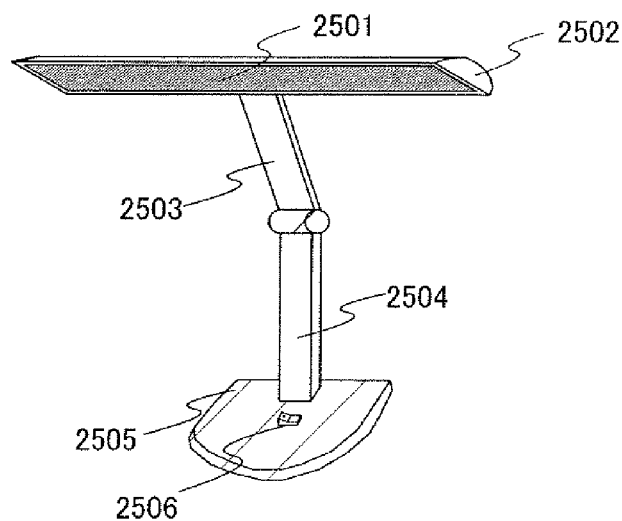

METHOD OF MANUFACTURING DISPLAY DEVICE

BACKGROUND OF THE INVENTION

1. Field of the Invention

The present invention relates to a method of manufacturing a display device, and particularly relates to a display device which uses a thin film transistor in a pixel portion and a method of manufacturing the display device.

2. Description of the Related Art

In recent years, a technique for forming a thin film transistor (TFT) with the use of a semiconductor thin film (with a thickness of several nanometers to several hundreds of nanometers) formed over a substrate having an insulating surface has attracted attention. Thin film transistors have been widely applied to electronic devices such as ICs and electro-optical devices, and their development especially as switching elements for image display devices has been accelerated. Channel regions of thin film transistors are formed of amorphous silicon or polycrystalline silicon.

As an alternative to these two kinds of semiconductors, TFTs whose channel regions are formed of microcrystalline silicon are also known (see Patent Document 1: Japanese Published Patent Application No. H4-242724 and Patent Document 2: U.S. Pat. No. 5,591,987). Microcrystalline silicon is formed by a plasma CVD method in a manner similar to amorphous silicon. For example, Patent Document 3 (Japanese Patent No. 3201492) has disclosed the invention, that is, a method of manufacturing a microcrystalline silicon film by a plasma CVD method with the use of a high frequency of a VHF (very high frequency) band of 30 MHz or more.

In general, in a case of forming a bottom-gate thin film transistor which uses a microcrystalline semiconductor film as a channel formation region, a semiconductor film with an amorphous structure is formed thinly at an interface with a gate insulating film. This thin semiconductor film with an amorphous structure might adversely affect electrical characteristics of the thin film transistor. In order to solve this problem, for example, Patent Document 4 (Japanese Published Patent Application No. H7-94749) has suggested a method in which a semiconductor film is formed at different speed in such a way that the speed is slow initially and is later increased.

Now, liquid crystal panels are manufactured as follows: a plurality of panels over a large-area glass substrate called a mother glass is processed, and then the panels are divided in accordance with the dimension of a screen of a TV or a personal computer. This is because the cost per panel can be reduced by taking plural panels out from one mother glass. In the market for liquid crystal TVs, the increase in screen size (panel size) and the decline in retail price have progressed rapidly. In order to increase the productivity in response to the increase in screen size and the decline in price, the enlargement of mother glasses has been promoted in these years.

Typical glass substrates around 1991 called the first generation were 300 mm×400 mm in size. After that, the mother glass has been enlarged in the second generation (400 mm×500 mm), the third generation (550 mm×650 mm), the fourth generation (730 mm×920 mm), the fifth generation (1000 mm×1200 mm), the sixth generation (2450 mm×1850 mm), the seventh generation (1870 mm×2200 mm), the eighth generation 2000 mm×2400 mm), the ninth generation (2450 mm×3050 mm), and the tenth generation (2850 mm×3050 mm).

SUMMARY OF THE INVENTION

However, in a case of forming a microcrystalline semiconductor film at decreased speed, an impurity element and the like such as oxygen (O) existing in a reaction chamber are easily taken into a film due to the decrease in the film-formation speed. Oxygen and the like taken into the film interrupt crystallization, and this causes a problem in that the electrical characteristics of a thin film transistor formed with the microcrystalline semiconductor film will deteriorate.

When a mother glass, i.e., a glass substrate becomes large, a plasma CVD apparatus for forming a microcrystalline silicon film over the large glass substrate also come to have a larger electrode area. In this case, the reaction chamber also has an inner wall with a large area; therefore, the microcrystalline silicon film easily takes in an impurity element during the film formation.

In addition, a plasma CVD apparatus has come to have an electrode whose size is close to the wavelength of the frequency of a high-frequency power source since glass substrates of the sixth generation began to be used. For example, the wavelength is 1100 mm at a power source frequency of 27 MHz; moreover, the wavelength is 500 mm at 60 MHz and 250 mm at 120 MHz. In such cases, an influence of surface standing wave appears remarkably, whereby plasma density distribution inside a reaction chamber of a plasma CVD apparatus becomes uneven. This causes problems in that a thin film formed over a glass substrate does not have in-plane uniformity; for example, the thin film does not have uniform film quality or thickness.

In view of the aforementioned problems, it is an object of the present invention to provide a thin film transistor with high electrical characteristics and high reliability even in a case of using a large-area substrate, and to provide a display device having the thin film transistor.

A method of manufacturing a display device of the present invention includes a step of forming a gate electrode over a substrate; a step of forming a gate insulating film over the gate electrode; a step of forming a microcrystalline semiconductor film over the gate insulating film by a plasma CVD method; and a step of forming an amorphous semiconductor film over the microcrystalline semiconductor film. In the step of forming the microcrystalline semiconductor film, plasma is produced in a reaction chamber and a reaction product is deposited over the gate insulating film formed over the substrate, whereby the microcrystalline semiconductor film is formed. In specific, the pressure in the reaction chamber is set at or below $10^{-5}$ Pa once, hydrogen and a silicon gas are introduced with a substrate temperature set in the range of 100° C. to 200° C. inclusive, and hydrogen plasma is made to act on the reaction product formed on a surface of the gate insulating film to perform etching (removal) while performing the film formation; thus, the microcrystalline semiconductor film is formed.

A method of manufacturing a display device of the present invention includes a step of forming a gate electrode over a substrate; a step of forming a gate insulating film over the gate electrode; a step of forming a microcrystalline semiconductor film over the gate insulating film by a plasma CVD method; and a step of forming an amorphous semiconductor film over the microcrystalline semiconductor film. In the step of forming the microcrystalline semiconductor film, plasma is produced in a reaction chamber and a reaction product is deposited over the gate insulating film formed over the substrate, whereby the microcrystalline semiconductor film is formed. In specific, the pressure in the reaction chamber is set at or below $10^{-5}$ Pa once, hydrogen and a rare gas are introduced with a substrate temperature set in the range of 100° C. to 200° C. inclusive, hydrogen plasma and rare gas plasma are made to act on a surface of the gate insulating film, a silicon gas is introduced, and the hydrogen plasma is made to act on the reaction product formed on the surface of the gate insulating film to perform etching (removal) while performing the film formation; thus, the microcrystalline semiconductor film is formed.

A method of manufacturing a display device of the present invention includes a step of forming a gate electrode over a substrate; a step of forming a gate insulating film over the gate electrode; a step of forming a microcrystalline semiconductor film over the gate insulating film by a plasma CVD method; and a step of forming an amorphous semiconductor film over the microcrystalline semiconductor film. In the step of forming the microcrystalline semiconductor film, plasma is produced in a reaction chamber and a reaction product is deposited over the gate insulating film formed over the substrate, whereby the microcrystalline semiconductor film is formed. In specific, the pressure in the reaction chamber is set at or below $10^{-5}$ Pa once, hydrogen and a silicon gas are introduced with a substrate temperature set in the range of 100° C. to 200° C. inclusive, plasma is produced by applying a first high-frequency electric power of an HF band (3 MHz to 30 MHz, typically 13.56 MHz) and a second high-frequency electric power of a VHF band (about 30 MHz to 300 MHz) superimposed on each other, and hydrogen plasma is made to act on the reaction product formed on the surface of the gate insulating film to remove the reaction product while performing the film formation. Thus, the microcrystalline semiconductor film is formed.

A method of manufacturing a display device of the present invention includes a step of forming a gate electrode over a substrate; a step of forming a gate insulating film over the gate electrode; a step of forming a microcrystalline semiconductor film over the gate insulating film by a plasma CVD method; and a step of forming an amorphous semiconductor film over the microcrystalline semiconductor film. In the step of forming the microcrystalline semiconductor film, plasma is produced in a reaction chamber and a reaction product is deposited over the gate insulating film formed over the substrate, whereby the microcrystalline semiconductor film is formed. In specific, the pressure in the reaction chamber is set at or below $10^{-5}$ Pa once, hydrogen and a rare gas are introduced with a substrate temperature set in the range of 100° C. to 200 ° C. inclusive, plasma is produced by applying a first high-frequency electric power of an HF band and a second high-frequency electric power of a VHF band which are superimposed on each other, hydrogen plasma and rare gas plasma are made to act on a surface of the gate insulating film, a silicon gas is introduced, and the hydrogen plasma is made to act on the reaction product formed on the surface of the gate insulating film to remove the reaction product while performing the film formation. Thus, the microcrystalline semiconductor film is formed.

In the method of manufacturing a display device of the present invention, the introduction of the rare gas is stopped or the flow rate of the rare gas is decreased before the introduction of the silicon gas.

In the method of manufacturing a display device of the present invention, the introduction of the rare gas is stopped or the flow rate of the rare gas is decreased after a predetermined period after the introduction of the silicon gas.

In the method of manufacturing a display device of the present invention, the oxygen concentration of the microcrystalline semiconductor film is made to be $1\times10^{17}$ atoms/cm$^3$ or less.

The display device includes a light-emitting device and a liquid crystal display device in its category. The light-emitting device includes a light-emitting element, and the liquid crystal display device includes a liquid crystal element. The light-emitting element includes an element whose luminance is controlled by current or voltage in its category; specifically, an inorganic EL (electro luminescent) element, an organic EL element, and the like are included.

In addition, the display device includes a panel in which a display element is sealed, and a module having the panel provided with an IC including a controller, and the like.

According to the present invention, a thin film transistor with high electrical characteristics and high reliability and a display device having the thin film transistor can be manufactured.

BRIEF DESCRIPTION OF THE DRAWINGS

FIG. 4 shows an example of a method of manufacturing a display device of the present invention.

FIGS. 13A to 13D each show an example of a usage mode of a display device of the present invention.

DETAILED DESCRIPTION OF THE INVENTION

Figure 1A:
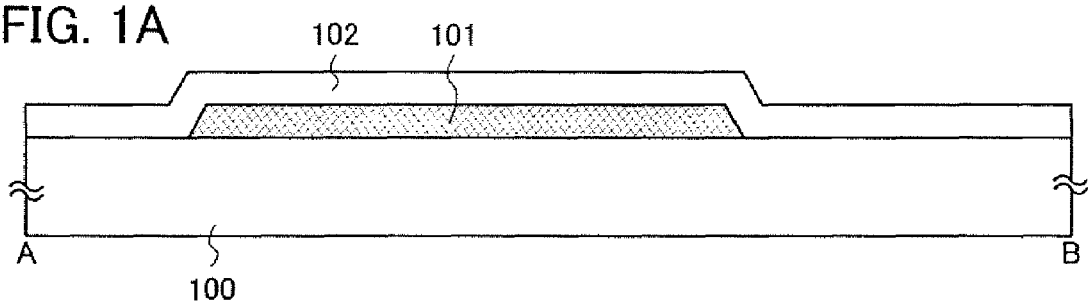
FIGS. 1A to 1D show an example of a method of manufacturing a display device of the present invention.

Embodiment modes of the present invention will hereinafter be described with reference to the drawings. However, since the present invention can be embodied in many different modes, it is easily understood by those skilled in the art that the mode and detail can be variously changed without departing from the scope and spirit of the present invention. Therefore, the present invention is not construed as being limited to the description of the embodiment modes. It is to be noted that in the drawings for describing the embodiment modes, the same portion or portions having a similar function are denoted by the same reference numeral and the description on such portions is not repeated.

Embodiment Mode 1

In this embodiment mode, a method of manufacturing a display device having a bottom-gate thin film transistor (TFT) is described with reference to drawings. In the following description, an n-channel thin film transistor is shown.

Figure 5A:
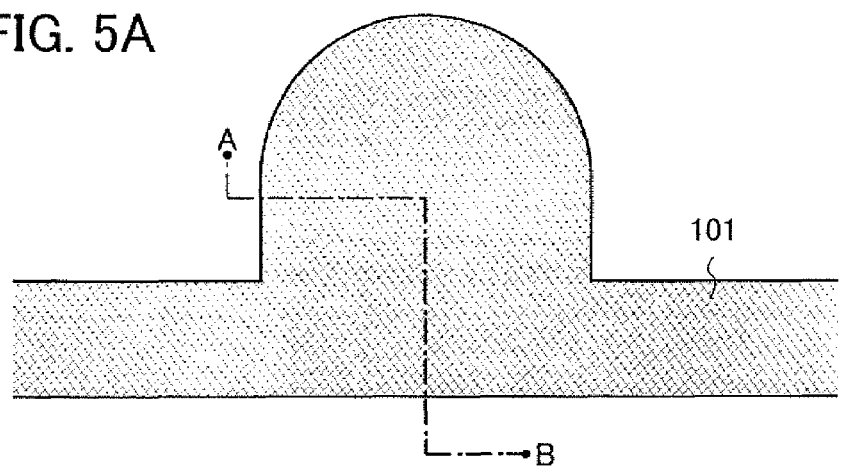
FIGS. 5A to 5C show an example of a method of manufacturing a display device of the present invention.

First, a gate electrode 101 is formed over a substrate 100, and a gate insulating film is formed over the gate electrode 101 (see FIG. 1A and FIG. 5A).

As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a heat-resistant plastic substrate that can resist process temperature of this manufacturing process; or the like. Alternatively, a metal substrate such as a stainless steel alloy substrate, which is provided with an insulating film on its surface, may be used.

The gate electrode 101 is formed of metal such as titanium, molybdenum, chromium, tantalum, tungsten, aluminum, or the like or its alloy. The gate electrode 101 can be formed in such a way that a conductive film is formed over the substrate 100 by a sputtering method or a vacuum evaporation method, a resist mask is formed over the conductive film by a photolithography technique or an inkjet method, and then the conductive film is etched by using the resist mask. A metal nitride film obtained by using the aforementioned metal may be provided between the substrate 100 and the gate electrode 101 as a barrier metal which improves the adherence of the gate electrode 101 and which prevents diffusion of impurity elements to a base.

The gate insulating film 102 can be formed by a silicon oxide film, a silicon nitride film, a silicon oxynitride film, or a silicon nitride oxide film by a CVD method, a sputtering method, or the like. Here, the gate insulating film 102 is formed by stacking a silicon oxide film or a silicon oxynitride film, and a silicon nitride film or a silicon nitride oxide film in this order. Instead of having the two layers, the gate insulating film may have three layers by stacking a silicon nitride film or a silicon nitride oxide film, a silicon oxide film or a silicon oxynitride film, and a silicon nitride film or a silicon nitride oxide film in this order from the substrate side. Alternatively, the gate insulating film may be a single layer of a silicon oxide film, a silicon nitride film, a silicon oxynitride film, or a silicon nitride oxide film.

It is to be noted that the silicon oxynitride film contains a larger amount of oxygen than nitrogen; specifically, it contains oxygen at concentrations ranging from 55 to 65 at. %, nitrogen at concentrations ranging from 1 to 20 at. %, silicon at concentrations ranging from 25 to 35 at. %, and hydrogen at concentrations ranging from 0.1 to 10 at. %. Moreover, it is to be noted that the silicon nitride oxide film contains a larger amount of nitrogen than oxygen; specifically, it contains oxygen at concentrations ranging from 15 to 30 at. %, nitrogen at concentrations ranging from 20 to 35 at. %, silicon at concentrations ranging from 25 to 35 at. %, and hydrogen at concentrations ranging from 15 to 25 at. %.

Figure 1B:
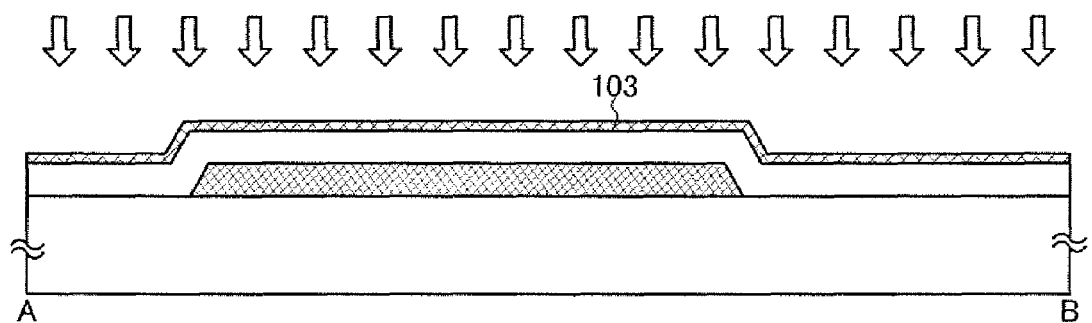

Next, a microcrystalline semiconductor film 103 having a microcrystalline structure (such as a microcrystalline silicon film) is formed over the gate insulating film 102 (see FIG. 1B).

The microcrystalline semiconductor film 103 is formed by depositing a reaction product by a plasma CVD method. An example of a step of forming a microcrystalline silicon film is described with reference to FIG. 4. The chart shown in FIG. 4 begins with a step of vacuum evacuation 200 of a reaction chamber from the atmospheric pressure, which is followed by steps of precoating 201, substrate installation 202, base pretreatment 203, film formation 204, substrate removal 205, and cleaning 206. These steps are shown in the time series.

First, vacuum evacuation of the reaction chamber is performed to a predetermined degree of vacuum. In this embodiment mode, the reaction chamber is made ultrahigh vacuum ($10^{-5}$ Pa or less) once so that impurity elements such as oxygen (O) are reduced as much as possible. In a case of performing ultrahigh vacuum evacuation to obtain a pressure below a degree of vacuum of $10^{-5}$ Pa, evacuation is performed by a turbomolecular pump and then vacuum evacuation is performed further by using a cryopump. In addition, degassing treatment is preferably performed by heating the reaction chamber so that gas is released through the inner wall. Moreover, a heater for heating the substrate is also operated to stabilize the temperature. The substrate is heated at temperatures ranging from 100° C. to 300° C. inclusive, preferably at 100° C. to 200° C. inclusive.

The precoating 201 is preferably performed by plasma treatment in such a way that a rare gas such as argon is introduced in order to remove gas adsorbed on the inner wall of the reaction chamber (atmospheric component such as oxygen or nitrogen, or an etching gas used for cleaning the reaction chamber). This treatment can attain higher degree of vacuum. Moreover, this treatment includes a process of covering the inner wall of the reaction chamber with a film of the same kind as a film to be deposited over the substrate. This embodiment mode shows the step of forming the microcrystalline silicon film, and a process for forming a silicon film as the film covering the inner wall is performed. In the precoating 201, after introducing a silane gas, a high-frequency electric power is applied to produce plasma. A silane gas reacts with oxygen, moisture, and the like. Therefore, oxygen and moisture in the reaction chamber can be removed by supplying a silane gas and moreover producing silane plasma.

The precoating 201 is followed by the substrate installation 202. Since the substrate over which the microcrystalline silicon film will be deposited is stored in a load chamber on which vacuum evacuation has been performed, the degree of vacuum of the load chamber will not deteriorate remarkably even if the substrate is installed therein.

The base pretreatment 203 is preferably performed because it is particularly effective in the case of forming the microcrystalline silicon film. That is to say, in a case of forming the microcrystalline silicon film on the surface of the gate insulating film provided over the glass substrate, an amorphous layer is formed in a reaction product (semiconductor film) deposited at an initial stage of the deposition due to impurity elements, lattice mismatch, or the like. In order to reduce the thickness of this amorphous layer as much as possible, or to eliminate the amorphous layer if possible, the base pretreatment 203 is preferably performed.

The base pretreatment 203 is preferably performed by one of or both rare gas plasma treatment and hydrogen plasma treatment. The rare gas plasma treatment preferably uses a rare gas element with large mass, such as argon, krypton, or xenon in order to remove oxygen, moisture, an organic substance, a metal element, and the like attached to the surface, by a sputtering effect. The hydrogen plasma treatment is effective for removing the impurities adsorbed on the surface, by hydrogen radicals and for forming a clean surface by an etching operation with respect to the insulating film or the amorphous silicon film. Moreover, when both the rare gas plasma treatment and the hydrogen plasma treatment are performed, generation of microcrystal nucleus is also promoted.

The film formation 204 for forming the microcrystalline silicon film is a process performed successively after the base pretreatment 203. The microcrystalline silicon film is formed by plasma with the use of a mixture of hydrogen and a silicon gas (a silicon hydride gas or a silicon halide gas). The silicon gas is diluted with hydrogen by 10 to 2000 times.

Here, hydrogen plasma is made to act on a semiconductor film formed on the surface of the gate insulating film 102 at an initial stage of the film formation so that the semiconductor film is formed while being removed (etched), whereby a microcrystalline semiconductor film is formed. In other words, a film growth reaction by deposition of $SiH_3$ radicals, and an etching reaction by hydrogen radicals are made to happen competitively, so that a semiconductor film including a microcrystalline structure is formed.

Moreover, in order to improve the crystallinity of the microcrystalline semiconductor film, the microcrystalline semiconductor film is preferably formed to have an oxygen concentration of $1 \times 10^{17}$ atoms/cm$^3$ or less. The oxygen concentration of the film can be measured by secondary ion mass spectrometry (SIMS).

In this embodiment mode, the semiconductor film deposited over the gate insulating film 102 at the initial stage of the film formation is formed while being removed (etched) by hydrogen plasma treatment, so that the generation of crystal nucleus over the gate insulating film 102 is promoted. With the use of this crystal nucleus, the microcrystalline semiconductor film is formed. Therefore, even in the case where the semiconductor film deposited at the initial stage of the deposition includes an amorphous layer due to impurity elements, lattice mismatch, or the like, the thickness of the amorphous layer can be reduced as much as possible and the microcrystalline semiconductor film can be formed more closely to the interface with the gate insulating film 102.

In this embodiment mode, since the semiconductor film is formed on the surface of the gate insulating film 102 while being removed, the semiconductor film is formed at low speed. However, even if the film-formation speed is decreased, it is possible to reduce the impurity elements such as oxygen (O) taken into the semiconductor film (oxidation of the semiconductor film, and the like) and to suppress the interruption of the crystallization because the semiconductor film is formed after reducing the adsorbed impurity elements such as moisture or oxygen (O) in the reaction chamber by once setting the pressure in the reaction chamber to ultrahigh vacuum ($10^{-5}$ Pa or less). As a result, the semiconductor film with high crystallinity can be formed more closely to the surface of the gate insulating film 102.

It is to be noted that the hydrogen plasma treatment is performed by adjusting the flow ratio of the hydrogen to the silicon gas. For example, the flow rate of the silicon gas is increased as the film formation goes on so that the flow ratio of the hydrogen to the silicon gas is decreased. At the start of the film formation, the flow rate of hydrogen:silicon is set to about 2000:1, and the flow rate of the silicon gas is gradually increased (the flow rate of hydrogen is decreased) until it is about 50:1 at the end of the film formation. Thus, the microcrystalline semiconductor film can be formed.

Moreover, the flow ratio of the hydrogen to the silicon gas may be increased and decreased repeatedly, so that the hydrogen plasma treatment is repeated. In this case, the deposition and removal (etching) of the semiconductor film are alternately performed so that the generation of microcrystal nuclei over the gate insulating film 102 can be promoted.

As shown by a dashed line 207 in FIG. 4, there may be a period during which a rare gas such as argon is supplied at the initial stage of the formation of the microcrystalline silicon film. The semiconductor film deposited on the surface of the gate insulating film 102 at the initial stage of the film formation is subjected to surface modification by operating argon plasma, and moisture and impurities adsorbed on the surface are removed. Thus, the generation of crystal nuclei can be promoted.

The substrate is heated at temperatures ranging from 100° C. to 300° C. inclusive, preferably from 100° C. to 200° C. inclusive, in order to deactivate the growth surface of the microcrystalline silicon film by using hydrogen and to promote the growth of the microcrystalline silicon.

The microcrystalline semiconductor film 103 can be formed by a high-frequency plasma CVD apparatus with frequencies ranging from several tens to several hundreds of megahertz or by a microwave plasma CVD apparatus with frequencies of 1 GHz or more.

Alternatively, the film formation or plasma treatment may be performed by utilizing plasma produced by applying a high-frequency electric power of an HF band (3 to 30 MHz, typically 13.56 MHz) and a high-frequency electric power of a VHF band (about 30 to 300 MHz) superimposed on each other. The plasma is produced by supplying a first high-frequency electric power which does not cause surface standing wave, and the density of the plasma is increased by supplying a second high-frequency electric power which is in the VHF band. Thus, a homogeneous thin film of favorable film quality can be formed over a large-area substrate having a long side of more than 2000 mm.

The precoating 201 performed before the plasma treatment can prevent the microcrystalline silicon film from taking in the metal included in the reaction chamber as impurity elements. In other words, covering the inside of the reaction chamber with silicon can prevent the reaction chamber from being etched by the plasma, so that the concentration of impurities included in the microcrystalline silicon film can be decreased.

In the film formation 204, helium may be added to a reaction gas. Helium has the highest ionization energy among all the gases, which is 24.5 eV, and has a metastable state at about 20 eV, which is a little lower than the ionization energy. Therefore, only 4 eV, which corresponds to the difference therebetween, is necessary for ionization while the discharging continues. Accordingly, helium exhibits the lowest discharge starting voltage among all the gases. Based on these characteristics, helium can maintain its plasma stably. Moreover, since uniform plasma can be generated, the plasma density can be homogenized even if a substrate over which the microcrystalline silicon film is deposited is large.

After forming the microcrystalline silicon, the supplies of the reaction gas such as silane and hydrogen and the high-frequency electric power are stopped, and then the substrate removal 205 is performed. In the case of successively performing the film formation on another substrate, the same process is performed from the substrate installation 202. The cleaning 206 is performed to remove the film or powder attached inside the reaction chamber.

The cleaning 206 is performed by plasma etching in such a way that an etching gas typified by $NF_3$ and $SF_6$ is introduced.

Alternatively, a gas which can etch without using plasma, such as $ClF_3$, is introduced to perform the cleaning 206. In the cleaning 206, the temperature is preferably decreased by turning off the heater for heating the substrate, in order to suppress the generation of a reaction by-product by the etching. After the cleaning 206, the precoating 201 is performed again, which is then followed by similar processes.

The microcrystalline semiconductor film 103 formed in this embodiment mode is a film including a semiconductor having an intermediate structure between amorphous and crystalline (including single-crystal and polycrystalline) structures. This semiconductor has a third state which is stable in terms of free energy, and is a crystalline semiconductor having short-range order and lattice distortion. Crystal grains of this semiconductor each with a grain diameter of 0.5 to 20 nm can exist by being dispersed in a non-single-crystal semiconductor. The microcrystalline silicon as a typical example of the microcrystalline semiconductor has its raman spectrum shifted to a lower wavenumber side than 520.6 $cm^{-1}$, which indicates single-crystal silicon. That is to say, the microcrystalline silicon has a peak of raman spectrum in the range of from 481 to 520.6 $cm^{-1}$, inclusive.

The threshold value of a thin film transistor can be controlled by adding an impurity element imparting p-type conductivity to a microcrystalline semiconductor film functioning as a channel formation region of the thin film transistor at the same time as or after the formation of the microcrystalline semiconductor film. A typical example of the impurity element imparting p-type conductivity is boron, and an impurity gas such as trimethylboron $((CH_3)_3B)$, $B_2H_6$, or $BF_3$ is preferably added to silicon hydride at a proportion of 1 ppm to 1000 ppm, preferably 1 ppm to 100 ppm. The concentration of boron is preferably set in the range of $1\times10^{14}$ atoms/$cm^3$ to $1\times10^{16}$ atoms/$cm^3$. Trimethylboron is preferable because it can be easily removed even if it is attached to an inner wall or the like of a reaction chamber. An i-type or p-type microcrystalline semiconductor film can be formed by controlling the concentration of boron.

The microcrystalline semiconductor film 103 is formed to be thicker than 0 nm and 50 nm or thinner, preferably to be thicker than 0 nm and 20 nm or thinner. The microcrystalline semiconductor film 103 functions as a channel formation region of a thin film transistor to be formed later. With the microcrystalline semiconductor film formed to a thickness within the above range, the thin film transistor to be formed later can be of completely depletion type.

Since the microcrystalline semiconductor film 103 is formed at a speed 10 times to 100 times as slow as an amorphous semiconductor film, the throughput can be increased by decreasing the film thickness.

Figure 1C:
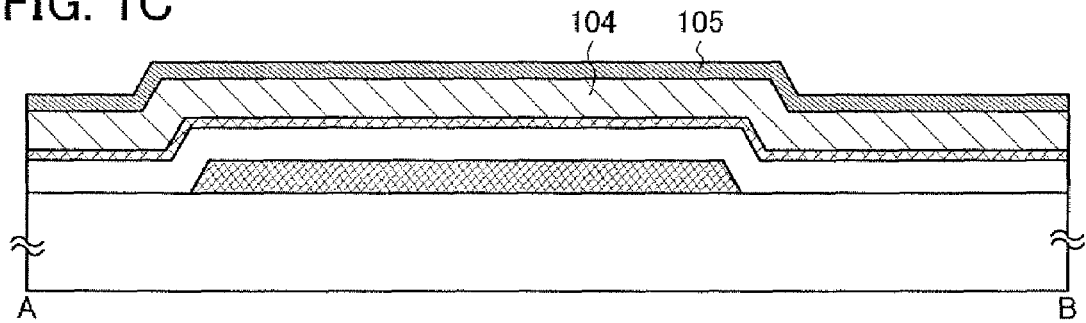

Next, an amorphous semiconductor film 104 (such as an amorphous silicon film) functioning as a buffer layer, and a semiconductor film 105 with an impurity element imparting one conductivity type added are formed sequentially over the microcrystalline semiconductor film 103 (see FIG. 1C).

It is preferable that the gate insulating film 102, the microcrystalline semiconductor film 103, and the amorphous semiconductor film 104 be formed successively. It is more preferable that the gate insulating film 102, the microcrystalline semiconductor film 103, the amorphous semiconductor film 104, and the semiconductor film 105 with an impurity element imparting one conductivity type added be formed successively. When the gate insulating film 102, the microcrystalline semiconductor film 103, and the amorphous semiconductor film 104 are formed successively without exposure to the air, the films can be stacked without contamination of each interface by atmospheric components and contamination impurity elements floating in the air. Thus, variation in characteristics of thin film transistors can be decreased.

Alternatively, after the microcrystalline semiconductor film 103 is formed, the amorphous semiconductor film 104 may be successively formed over the microcrystalline semiconductor film 103 in such a way that the flow rates of the hydrogen and the silicon gas are further controlled to decrease the hydrogen and increase the silicon gas so that the flow ratio the hydrogen to the silicon gas is decreased. The step of forming the amorphous semiconductor film 104 may be performed only with the silicon gas (a silicon hydride gas or a silicon halide gas) by further decreasing the flow rate of hydrogen. In the latter case, the amorphous semiconductor film 104 can be formed over the microcrystalline semiconductor film 103 without exposure of the growth surface of the microcrystalline semiconductor film 103 to the air.

The amorphous semiconductor film 104 functioning as a buffer layer can be formed by a plasma CVD method with the use of silicon hydride such as $SiH_4$ or $Si_2H_6$. Moreover, the aforementioned silicon hydride may be diluted with one kind or plural kinds of rare gas elements selected from helium, argon, krypton, or neon to form the amorphous semiconductor film. The amorphous semiconductor film 104 can be formed using hydrogen with its flow rate 1 to 20 times, preferably 1 to 10 times, and more preferably 1 to 5 times the flow rate of the silicon hydride. Alternatively, an amorphous semiconductor film including nitrogen can be formed using the aforementioned silicon hydride and one of nitrogen and ammonia. Further, an amorphous semiconductor film including fluorine, chlorine, bromine, or iodine can be formed using the aforementioned silicon hydride and a gas including one of fluorine, chlorine, bromine, and iodine, respectively (the gas corresponds to, for example, $F_2$, $Cl_2$, $Br_2$, $I_2$, HF, HCl, HBr, or HI). It is to be noted that the silicon hydride may be replaced by $SiH_2Cl_2$, $SiHCl_3$, $SiCl_4$, $SiF_4$, or the like.

The amorphous semiconductor film 104 can be formed by sputtering an amorphous semiconductor, which is a target, with the use of hydrogen or a rare gas. At this time, an amorphous semiconductor film including nitrogen can be formed when the atmosphere includes ammonia, nitrogen, or $N_2O$. Further, an amorphous semiconductor film including fluorine, chlorine, bromine, or iodine can be formed when the atmosphere includes a gas that contains fluorine, chlorine, bromine, or iodine, respectively (the gas corresponds to, for example, $F_2$, $Cl_2$, $Br_2$, $I_2$, HF, HCl, HBr, or HI).

The amorphous semiconductor film 104 is preferably formed of an amorphous semiconductor without crystal grains. Therefore, in a case of forming the amorphous semiconductor film 104 by a high-frequency plasma CVD method with frequencies ranging from several tens to several hundreds of megahertz or a microwave plasma CVD method, it is preferable to control the film-formation condition so that an amorphous semiconductor without crystal grains is formed. The amorphous semiconductor film 104 may be formed of an amorphous semiconductor imparting n-type conductivity (such as an amorphous silicon film).

The amorphous semiconductor film 104 is preferably formed to a thickness such that the amorphous semiconductor film 104 partly remains even if the amorphous semiconductor film 104 is partly etched in a later process for forming a source region and a drain region. Typically, the amorphous semiconductor film 104 is preferably formed to a thickness from 100 nm to 500 nm, more preferably 200 nm to 300 nm inclusive. In a display device typified by a liquid crystal display device, in which high voltage (for example, about 15 V) is applied to a thin film transistor, the amorphous semiconductor film 104 functioning as a buffer layer with a thickness within the above range has high withstand voltage. Therefore, even when high voltage is applied to the thin film transistor, it is possible to prevent the thin film transistor from deteriorating. With the amorphous semiconductor film 104 formed to a thickness within the above range, the amorphous semiconductor film 104 can be formed to be thicker than the microcrystalline semiconductor film 103.

When an amorphous semiconductor film or an amorphous semiconductor film including hydrogen, nitrogen, or halogen is formed on a surface of the microcrystalline semiconductor film 103, a surface of a crystal grain in the microcrystalline semiconductor film 103 can be prevented from being naturally oxidized. In particular, a region where the amorphous semiconductor and the microcrystal grain are in contact with each other easily cracks due to crystal lattice distortion. When oxygen enters this crack, the crystal grains are oxidized to form silicon oxide. However, the formation of the amorphous semiconductor film 104 functioning as a buffer layer on the surface of the microcrystalline semiconductor film 103 can prevent the crystal grains in the microcrystalline semiconductor film 103 from being oxidized. Moreover, the formation of the buffer layer can prevent etching residue produced at the time of later forming a source region and a drain region from mixing into the microcrystalline semiconductor film.

Since the amorphous semiconductor film 104 is formed of an amorphous semiconductor or an amorphous semiconductor including hydrogen, nitrogen, or halogen, as compared with the microcrystalline semiconductor film 103, the amorphous semiconductor film 104 has a larger energy gap (an amorphous semiconductor has an energy gap of 1.6 to 1.8 eV and a microcrystalline semiconductor has an energy gap of 1.1 to 1.5 eV), higher resistance, and lower mobility. Therefore, in a thin film transistor to be formed later, the amorphous semiconductor film 104 formed between the microcrystalline semiconductor film 103 and each of source and drain regions functions as a high-resistance region, whereas the microcrystalline semiconductor forming the microcrystalline semiconductor film 103 functions as a channel formation region.

In a case where the semiconductor film 105 to which an impurity element imparting one conductivity type is added forms an n-channel thin film transistor, phosphorus may be used as a typical impurity element; specifically, an impurity gas such as $PH_3$ may be added to silicon hydride. On the other hand, in a case of forming a p-channel thin film transistor, boron may be added as a typical impurity element; specifically, an impurity gas such as trimethylboron $((CH_3)_3B)$ or $B_2H_6$ may be added to silicon hydride. The semiconductor film 105 with an impurity element imparting one conductivity type added can be formed of a microcrystalline semiconductor or an amorphous semiconductor. The semiconductor film 105 with an impurity element imparting one conductivity type added is formed to a thickness of 2 nm to 50 nm inclusive. Throughput can be increased by decreasing the film thickness of the semiconductor film with an impurity element imparting one conductivity type added.

Figure 1D:
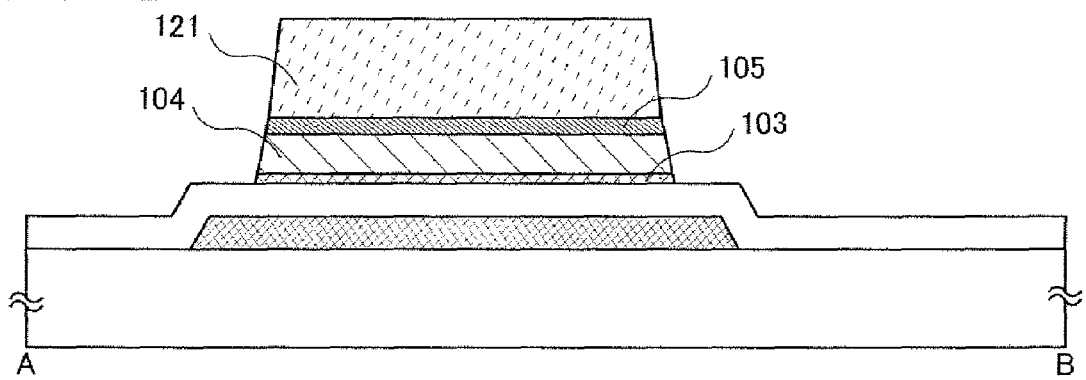
Figure 5B:
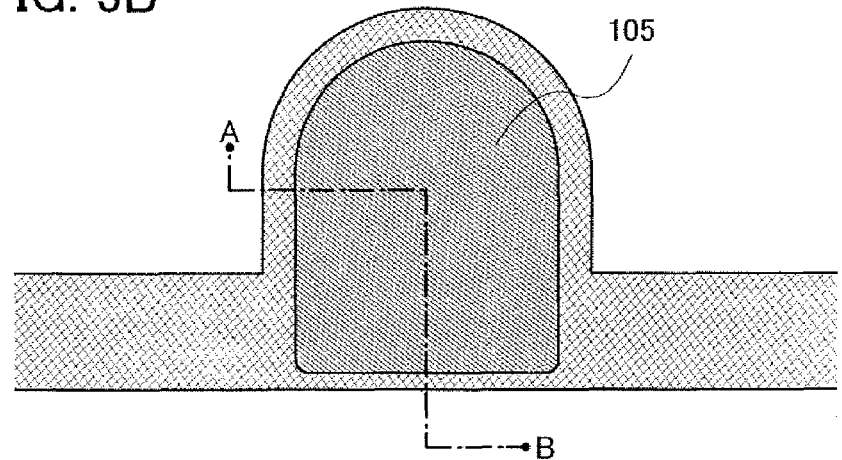

Next, a mask 121 is formed over the semiconductor film 105 with an impurity element imparting one conductivity type added. Then, the microcrystalline semiconductor film 103, the amorphous semiconductor film 104, and the semiconductor film 105 with an impurity element imparting one conductivity type added are etched by using the mask 121 (see FIG. 1D and FIG. 5B). After that, the mask 121 is removed.

The mask 121 is formed by a photolithography technique or an inkjet method.

Figure 2A:
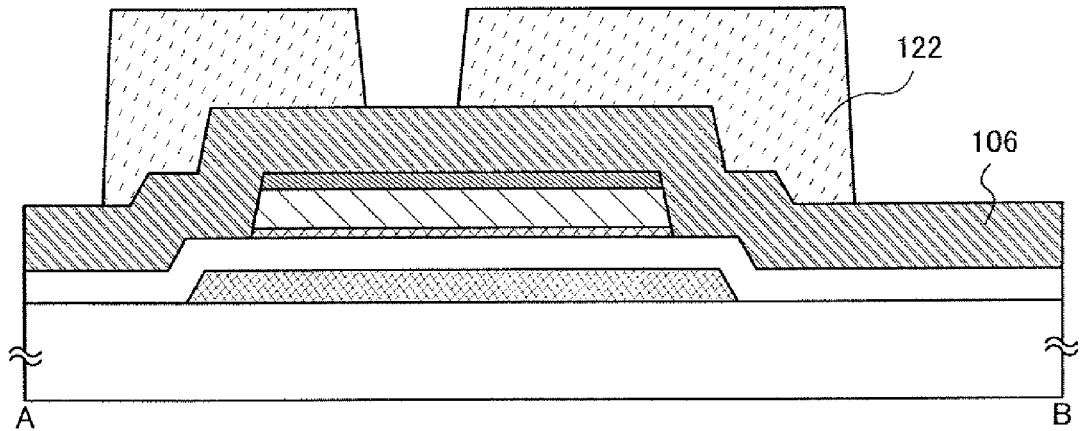
FIGS. 2A to 2C show an example of a method of manufacturing a display device of the present invention.

Subsequently, a conductive film 106 is formed over the gate insulating film 102 and the semiconductor film 105 that remains after the etching, and a mask 122 is formed over the conductive film 106 (see FIG. 2A).

The conductive film 106 is preferably formed as a single layer or stacked layers with the use of aluminum; copper; or an aluminum alloy to which an element for improving heat resistance or preventing hillocks, such as silicon, titanium, neodymium, scandium, or molybdenum is added. Alternatively, the conductive film 106 may have a stacked-layer structure in which a film in contact with the semiconductor film 105 is formed of titanium, tantalum, molybdenum, tungsten, or a nitride of any of these elements, and a film of aluminum or an aluminum alloy is formed thereover. Further alternatively, the conductive film 106 may have a stacked-layer structure in which a film of aluminum or an aluminum alloy is sandwiched between films of titanium, tantalum, molybdenum, tungsten, or a nitride of any of these elements. For example, the conductive film 106 can have a three-layer structure formed by sequentially stacking a molybdenum film, an aluminum film, and a molybdenum film. Alternatively, the conductive film 106 can have a three-layer structure formed by sequentially stacking a titanium film, an aluminum film, and a titanium film.

The conductive film 106 is formed by a sputtering method or a vacuum evaporation method. The conductive film 106 may alternatively be formed by printing a conductive nanopaste of silver, gold, copper, or the like in accordance with a screen printing method, an inkjet method, or the like and baking the printed nanopaste.

The mask 122 can be formed in a manner similar to the mask 121.

Although this embodiment mode shows the case of forming the conductive film 106 after patterning the microcrystalline semiconductor film 103, the amorphous semiconductor film 104, and the semiconductor film 105 in FIG. 1C, the step of FIG. 1C may be omitted and the mask 122 may be formed after sequentially stacking the microcrystalline semiconductor film 103, the amorphous semiconductor film 104, the semiconductor film 105, and the conductive film 106 successively. In the latter case, the mask 121 is not necessary; therefore, the process can be simplified.

Figure 2B:
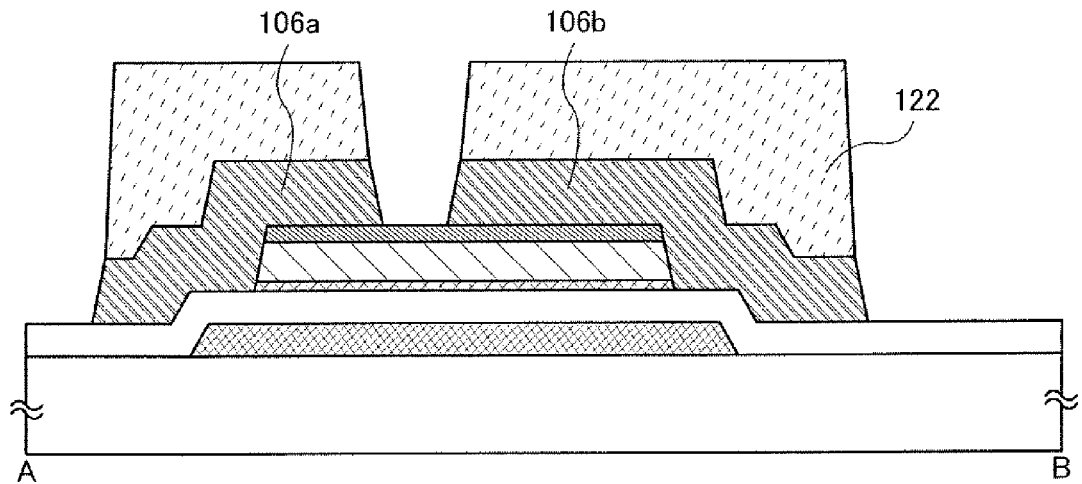
Figure 5C:
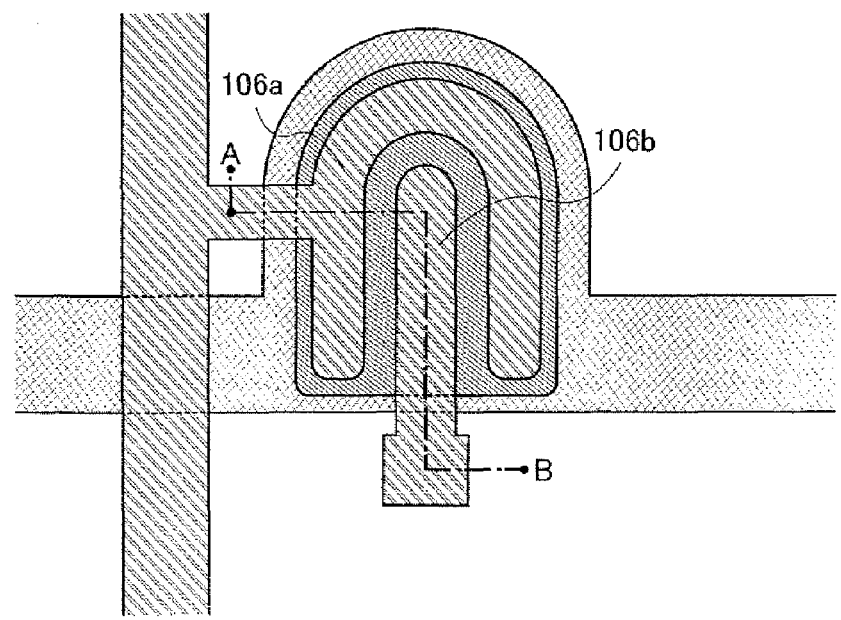

Next, the conductive film 106 is etched by using the mask 122 so as to be divided into a source electrode 106a and a drain electrode 106b (see FIG. 2B and FIG. 5C).

Figure 2C:
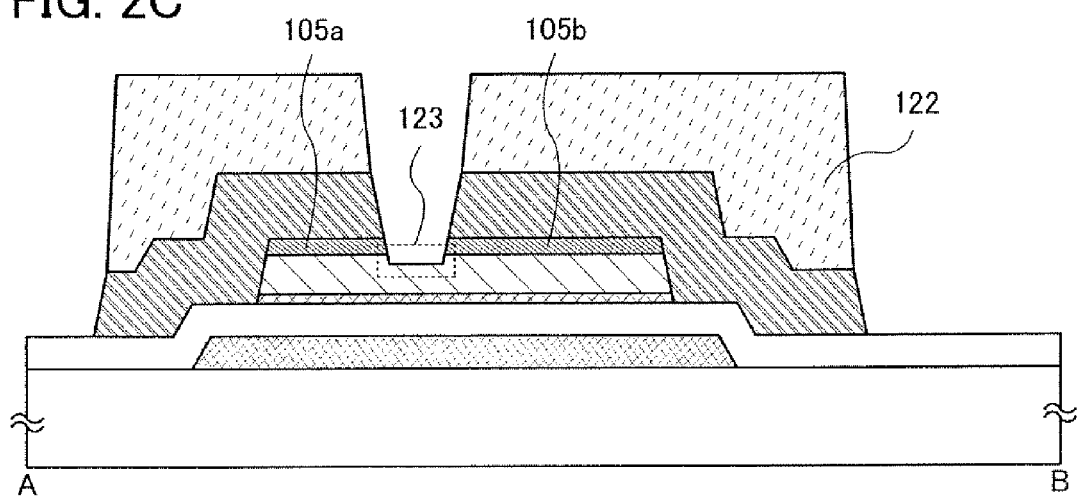
Figure 6A:
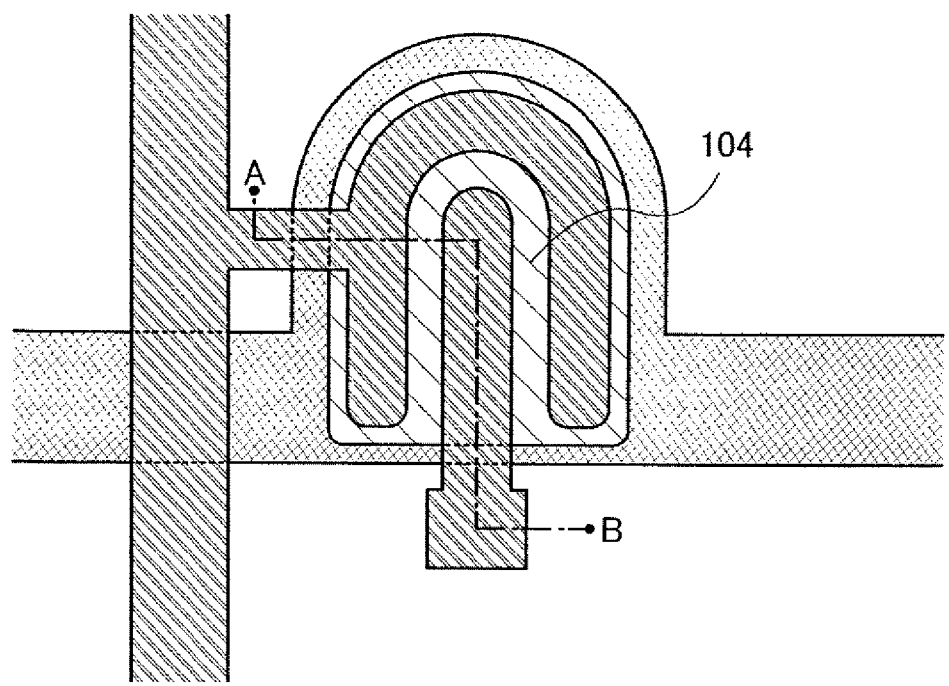
FIGS. 6A and 6B show an example of a method of manufacturing a display device of the present invention.

Next, the semiconductor film 105 with an impurity element imparting conductivity added and the amorphous semiconductor film 104 functioning as a buffer layer are etched with the use of the mask 122, whereby a source region 105a and a drain region 105b, and the source electrode 106a and the drain electrode 106b are formed (see FIG. 2C and FIG. 6A). It is to be noted that the amorphous semiconductor film 104 functioning as a buffer layer is the one partly etched and covers the surface of the microcrystalline semiconductor film 103. Here, a dent is formed at the surface of the amorphous semiconductor film 104 between the source region 105a and the drain region 105b. At this time, end portions of the source region 105a and the drain region 105b are almost aligned with end portions of the source electrode 106a and the drain electrode 106b, respectively.

Figure 3A:
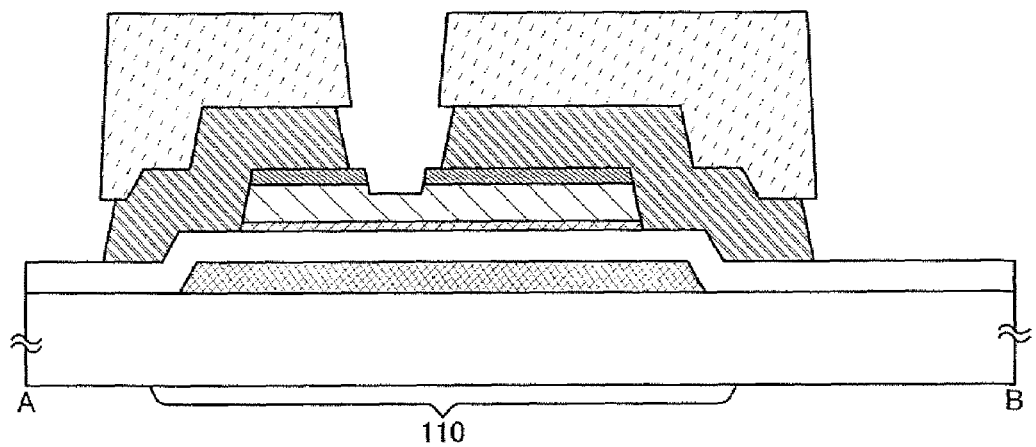
FIGS. 3A to 3C show an example of a method of manufacturing a display device of the present invention.
Figure 6B:
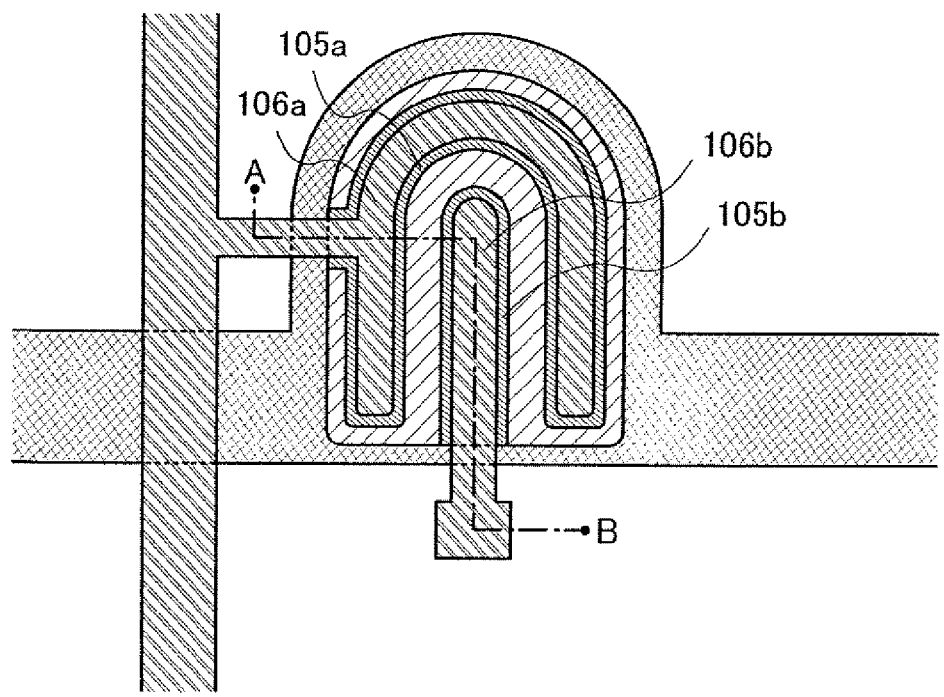

Next, the source electrode 106a and the drain electrode 106 are partly etched (see FIG. 3A and FIG. 6B).

Here, wet etching is performed by using the mask 122 to etch the end portions of the source electrode 106a and the drain electrode 106b as selected. As a result, the end portions of the source electrode 106a and the drain electrode 106b are not aligned with but are displaced from the end portions of the source region 105a and the drain region 105b, respectively. The end portions of the source region 105a and the drain region 105b are placed outer than the end portions of the source electrode 106a and the drain electrode 106b, respectively.

After that, the mask 122 is removed. The source electrode 106a and the drain electrode 106b also function as a source wiring and a drain wiring, respectively.

When the end portions of the source region 105a and the drain region 105b are not aligned with but are displaced from the end portions of the source electrode 106a and the drain electrode 106b, respectively, the end portions of the source electrode 106a the drain region 106b are apart from each other. This can prevent leakage current and short circuit between the source electrode 106a and the drain electrode 106b. Moreover, since the end portions of the source region 105a and the drain region 105b are not aligned with but are displaced from the end portions of the source electrode 106a and the drain electrode 106b, respectively, an electric field does not concentrate on the end portions of the source region 105a and the drain region 105b and the source electrode 106a and the drain electrode 106b. This can prevent leakage current between the gate electrode 101, and the source electrode 106a and the drain electrode 106b. Therefore, a thin film transistor with high reliability and high withstand voltage can be manufactured.

Through the above steps, a channel-etched thin film transistor 110 can be formed.

The thin film transistor shown in this embodiment mode has a dent (groove) formed at a part of the amorphous semiconductor film 104, and a region other than the dent is covered with the source region 105a and the drain region 105b. That is to say, the source region 105a and the drain region 105b are formed apart from each other because of a dent 123 formed in the amorphous semiconductor film 104; therefore, the amount of leakage current flowing between the source region 105a and the drain region 105b can be decreased. Moreover, since the dent 123 is formed by partly etching the amorphous semiconductor film 104, etching residue left in the step of forming the source region 105a and the drain region 105b can be removed. Therefore, leakage current (parasitic channel) flowing between the source region 105a and the drain region 105b through the residue can be prevented.

A buffer layer is formed between the microcrystalline semiconductor film functioning as a channel formation region and each of the source region 105a and the drain region 105b. Moreover, the surface of the microcrystalline semiconductor film is covered with the buffer layer. The buffer layer formed to have high resistance extends to exist even between the microcrystalline semiconductor and each of the source region 105a and the drain region 105b; therefore, the amount of leakage current flowing through the thin film transistor can be decreased and deterioration due to application of high voltage can be suppressed. In addition, an amorphous semiconductor whose surface is terminated with hydrogen is formed as the buffer layer on the surface of the microcrystalline semiconductor film; therefore, it is possible to prevent the microcrystalline semiconductor film from being oxidized and to prevent etching residue produced at the time of later forming the source region 105a and the drain region 105b from mixing into the microcrystalline semiconductor film.

Further, since the end portions of the source electrode and the drain electrode are not aligned with but are displaced from the end portions of the source region and the drain region, the end portions of the source electrode and the drain electrode are placed apart from each other. Therefore, leakage current and short circuit between the source electrode and the drain electrode can be prevented.

Figure 3B:
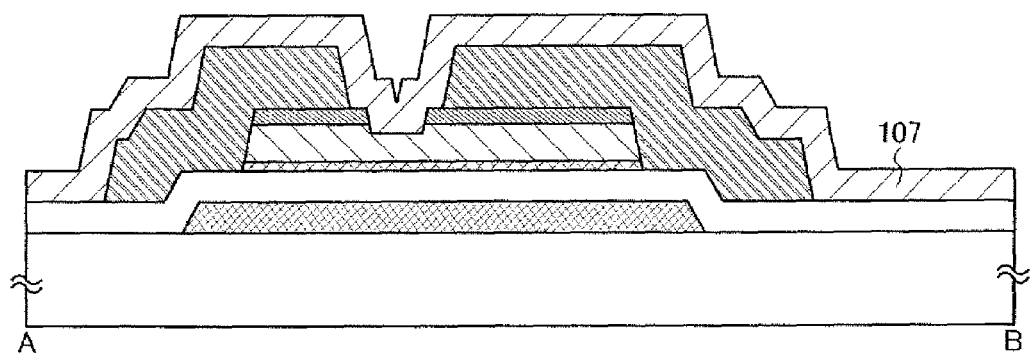

Next, an insulating film 107 is formed over the source electrode 106a, the drain electrode 106b, the source region 105a, the drain region 105b, the amorphous semiconductor film 104, and the gate insulating film 102 (see FIG. 3B). The insulating film 107 can be formed in a manner similar to the gate insulating film 102. It is to be noted that the insulating film 107 is preferably a dense film because it prevents the intrusion of contamination impurities such as moisture, metal, and an organic substance floating in the air.

Figure 3C:
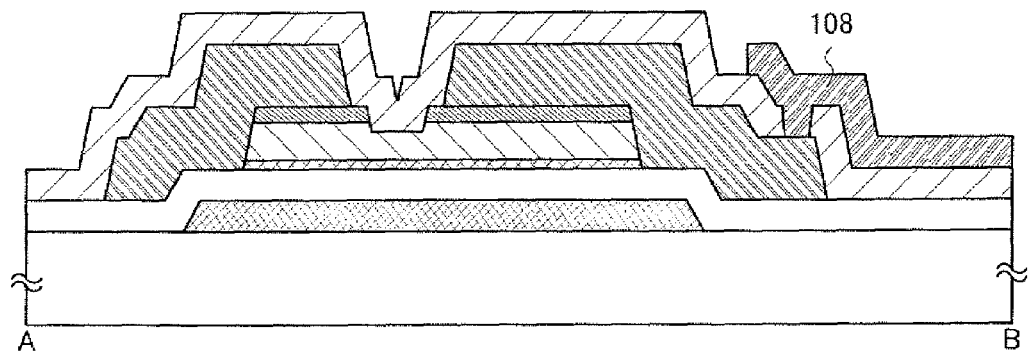
Figure 7:
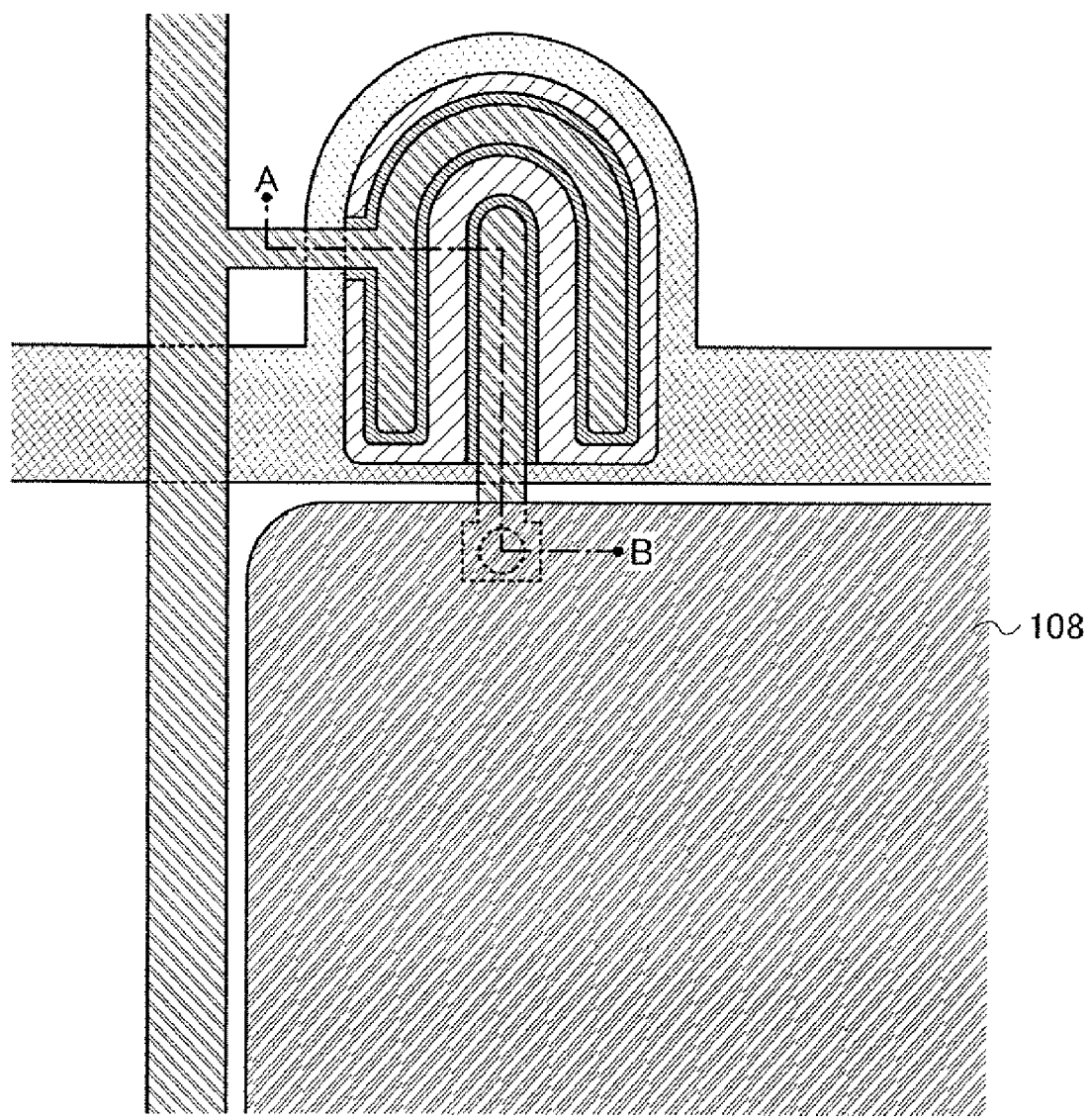
FIG. 7 shows an example of a method of manufacturing a display device of the present invention.

Next, a contact hole is formed in the insulating film 107, and a pixel electrode 108 in contact with the drain electrode 106b through the contact hole is formed (see FIG. 3C and FIG. 7).

The pixel electrode 108 can be formed of a conductive material with a light-transmitting property, such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide including silicon oxide.

Alternatively, the pixel electrode 108 can be formed of a conductive composition including a conductive macromolecule (also called a conductive polymer). The pixel electrode formed of a conductive composition preferably has a sheet resistance of 10000 Ω/square or less, and a light transmittance of 70% or more at a wavelength of 550 nm. Moreover, the conductive macromolecule in the conductive composition preferably has a resistivity of 0.1 Ω·cm or less.

As the conductive macromolecule, a so-called π-electron conjugated conductive macromolecule can be used. As examples thereof, polyaniline or a derivative thereof, polypyrrole or a derivative thereof, polythiophene or a derivative thereof, a copolymer of two or more kinds of them, and the like can be given.

Through the above steps, a display device having the thin film transistor 110 in a pixel portion can be obtained. Although this embodiment mode shows the case of forming the n-channel thin film transistor, a p-channel thin film transistor can be similarly formed by replacing the semiconductor film 105 with a semiconductor film in which an impurity element imparting p-type conductivity is added.

The thin film transistor 110 shown in this embodiment mode can be formed by a fewer number of steps; therefore, the cost can be reduced. When the microcrystalline semiconductor film 103 which functions as a channel formation region is formed of a microcrystalline semiconductor, an electric field effect mobility of 1 to 20 $cm^2$/V·sec can be obtained. This embodiment mode shows the example of applying the thin film transistor 110 as a switching element of a pixel in a pixel portion; however, there is no limitation on this and the thin film transistor 110 can alternatively be used as an element that forms a driving circuit on a scanning line (gate line) side, or the like.

This embodiment mode can be implemented in combination with any of structures or manufacturing methods described in other embodiment modes.

Embodiment Mode 2

Figure 11:
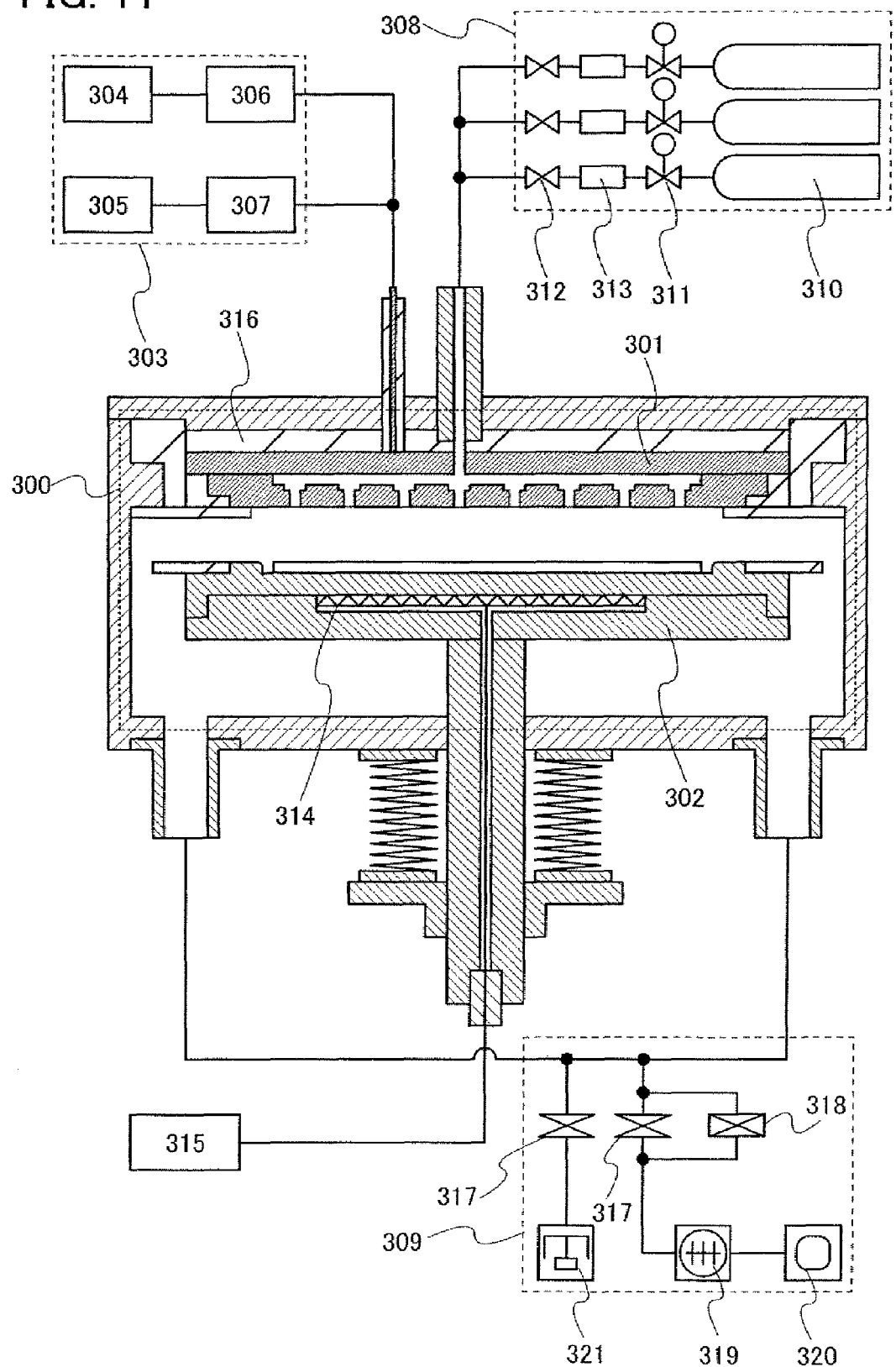
FIG. 11 shows an example of a plasma CVD apparatus used in manufacturing a display device of the present invention.

In this embodiment mode, an example of a structure of the plasma CVD apparatus used for forming the microcrystalline semiconductor film in Embodiment Mode 1 is described with reference to FIG. 11. Specifically, an example of a structure of a plasma CVD apparatus in which a plurality of high-frequency electric powers is applied is described in this embodiment mode.

A reaction chamber 300 is formed of a rigid material such as aluminum or stainless steel, and the inside of the reaction chamber 300 can be evacuated to vacuum. The reaction chamber 300 is provided with a first electrode 301 and a second electrode 302.

A high-frequency electric power supplying means 303 is connected to the first electrode 301, whereas a ground potential is given to the second electrode 302. The substrate can be disposed over the second electrode 302. The first electrode 301 is isolated from an inner wall of the reaction chamber 300 by an insulator 316, so that the high-frequency electric power does not leak out. Although FIG. 11 shows the structure in which the first electrode 301 and the second electrode 302 are of capacitive coupling type (parallel flat plate type), another structure such as inductive coupling type may be employed as long as plasma can be produced inside the reaction chamber 300 by applying two or more different high-frequency electric powers.

The high-frequency electric power supplying means 303 includes a first high-frequency power source 304 and a second high-frequency power source 305, and a first matching box 306 and a second matching box 307 corresponding to those power sources 304 and 305, respectively. Both high-frequency electric powers output from the first high-frequency power source 304 and the second high-frequency power source 305 are supplied to the first electrode 301. The first matching box 306 or the second matching box 307 may be provided with, at its output side, a band pass filter so that the other high-frequency electric power does not enter.

The first high-frequency power source 304 supplies a high-frequency electric power at a wavelength of about 10 m or longer with frequencies of 3 to 30 MHz, that is an HF band, and typically a frequency of 13.56 MHz. The second high-frequency power source 305 supplies a high-frequency electric power at a wavelength of shorter than approximately 10 m with frequencies of 30 to 300 MHz, which are the frequencies of a VHF band.

That is to say, the wavelength of the high frequency electric power supplied by the first high-frequency power source 304 is three times or more as long as the length of one side of the first electrode 301, and the wavelength of the high frequency electric power supplied by the second high-frequency power source 305 is shorter than the length of one side of the first electrode 301. The plasma is produced by supplying a high-frequency electric power which does not cause surface standing wave, and the density of the plasma is increased by supplying a high-frequency electric power which is in the VHF band. Thus, a homogeneous thin film of favorable film quality can be formed over a large-area substrate having a long side of more than 2000 mm.

The first electrode 301 is also connected to a gas supplying means 308. The gas supplying means 308 includes a cylinder 310 which is filled with a reaction gas, a pressure adjusting valve 311, a stop valve 312, a mass flow controller 313, and the like. In the reaction chamber 300, a surface of the first electrode 301 which faces the substrate is processed into a shower plate so as to have a plurality of small holes. The reaction gas is supplied to the reaction chamber 300 from an inner hollow structure of the first electrode 301 through these small holes.

Figure 12:
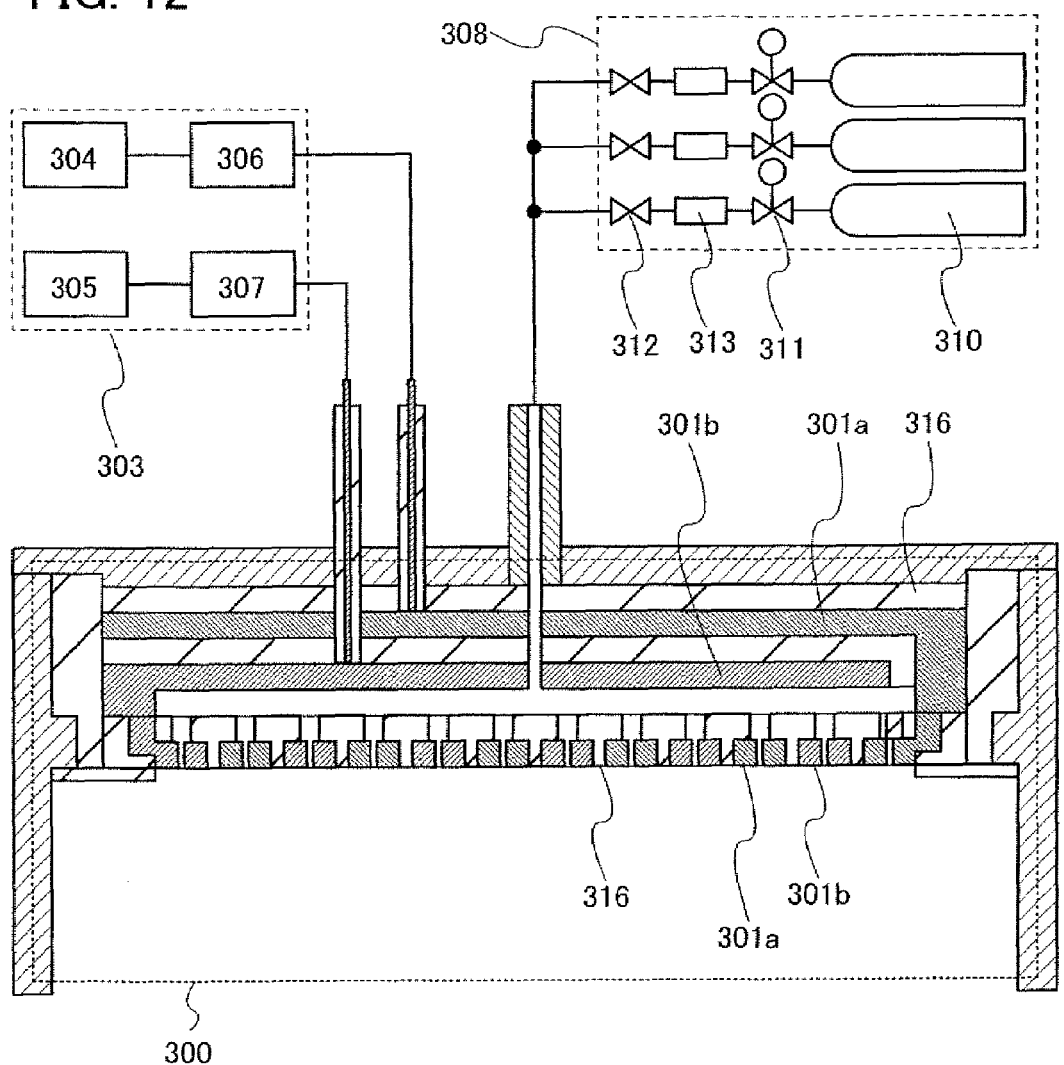
FIG. 12 shows an example of a plasma CVD apparatus used in manufacturing a display device of the present invention.

FIG. 12 shows another structure of the first electrode 301. The first electrode 301 is divided into a first electrode 301a and a first electrode 301b. The first high-frequency power source 304 supplies a high-frequency electric power to the first electrode 301a, and the second high-frequency electric power source 305 supplies a high-frequency electric power to the first electrode 301b. The surface of each of the first electrode 301a and the first electrode 301b which faces the substrate is provided with small holes. In addition, the first electrode 301a and the first electrode 301b are disposed in a comb-like form so as to engage with each other, and are isolated by the insulator 316 so that the adjacent electrodes are not in contact with each other. The structure shown in FIG. 12 can be replaced by the first electrode 301 shown in FIG. 11, and a similar effect can be obtained.

An evacuation means 309 connected to the reaction chamber 300 includes a function of vacuum evacuation and a function of controlling to keep the reaction chamber 300 at a predetermined pressure when the reaction gas is supplied. The evacuation means 309 includes a butterfly valve 317, a conductance valve 318, a turbomolecular pump 319, a dry pump 320, and the like. In a case of arranging the butterfly valve 317 and the conductance valve 318 in parallel, the butterfly valve 317 is closed and the conductance valve 318 is operated to control the evacuation speed of the reaction gas, so that the pressure in the reaction chamber 300 can be controlled to remain in a predetermined range. Moreover, to open the butterfly valve 317 having higher conductance makes it possible to perform high-vacuum evacuation.

In the case of performing ultrahigh vacuum evacuation to obtain a pressure lower than $10^{-5}$ Pa, a cryopump 321 is preferably used in combination. Alternatively, in the case of performing evacuation to attain the degree of ultrahigh vacuum, the inner wall of the reaction chamber 300 may be processed into a mirror surface, and a heater for baking may be provided to decrease the amount of gas released from the inner wall.

The second electrode 302 is provided with a substrate heater 314 temperature of which is controlled by a heater controller 315. When the substrate heater 314 is provided in the second electrode 302, a heat conduction method is employed, and a sheathed heater or the like is used as the substrate heater 314. The second electrode 302 may be movable so that its height can be adjusted, whereby the distance between the first electrode 301 and the second electrode 302 can be changed as appropriate.

With the reaction chamber of the plasma CVD apparatus of this embodiment mode, an insulating film typified by a silicon oxide film or a silicon nitride film, a semiconductor film typified by a microcrystalline silicon film or an amorphous silicon film, and other various kinds of thin films used for TFTs and photo-electric converting devices can be formed. In particular, the reaction chamber is effectively used in the case of forming the thin film over a large-area substrate with a long side of more than 2000 mm.

Although Embodiment Mode 1 shows the case of forming the microcrystalline semiconductor film 103 with the use of the plasma CVD apparatus shown in this embodiment mode, the present invention is not limited to this, and a variety of thin films can be formed by replacing the reaction gas. As the semiconductor film that can be formed by the plasma apparatus shown in this embodiment mode, an amorphous silicon film, an amorphous silicon germanium film, an amorphous silicon carbide film, a microcrystalline silicon germanium film, a microcrystalline silicon carbide film, or the like is given. As the insulating film that can be formed by the plasma apparatus shown in this embodiment mode, a silicon oxide film, a silicon nitride film, a silicon oxynitride film, a silicon nitride oxide film, or the like is given.

This embodiment mode can be implemented in combination with any of structures or manufacturing methods described in other embodiment modes.

Embodiment Mode 3

In this embodiment mode, an example of a structure of a plasma CVD apparatus in which the reaction chamber shown in Embodiment Mode 2 is applied, which is suitable for forming a plurality of films (here, a gate insulating film and a semiconductor film of a TFT), is described with reference to FIG. 18.

Figure 18:
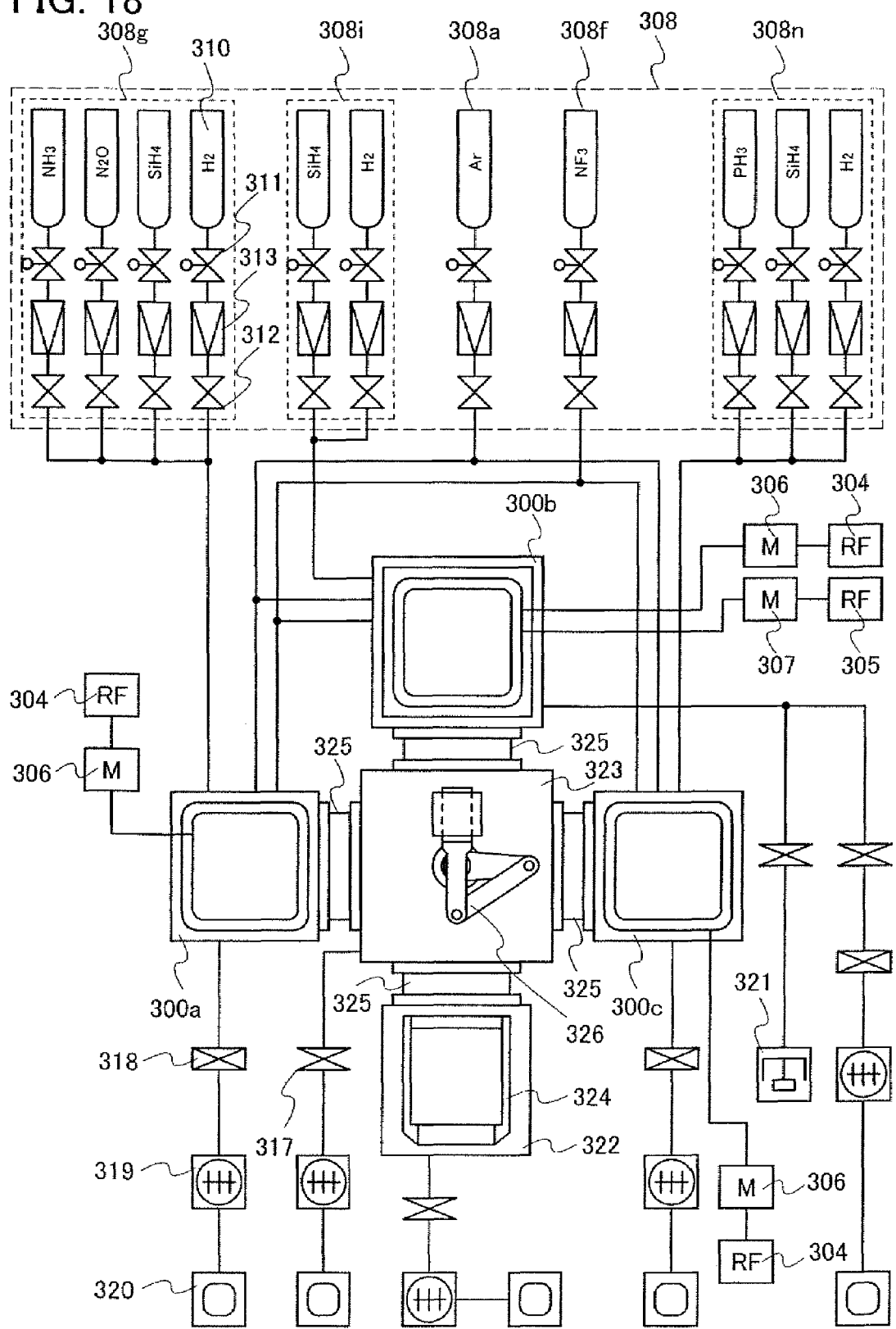
FIG. 18 shows an example of a plasma CVD apparatus used in manufacturing a display device of the present invention.

FIG. 18 shows an example of a multichamber plasma CVD apparatus provided with a plurality of reaction chambers. This apparatus includes a common chamber 323, a load/unload chamber 322, a first reaction chamber 300a, a second reaction chamber 300b, and a third reaction chamber 300c. This apparatus has a single-wafer structure and each of substrates loaded in a cassette 324 in the load/unload chamber 322 is installed in and removed from each chamber by a delivery mechanism 326 of the common chamber 323. A gate valve 325 is provided between each chamber and the common chamber 323, so that the process performed in each chamber does not interfere with each other.

Each chamber is used for different purposes depending on the kind of a thin film to be formed. For example, the first reaction chamber 300a is used for forming an insulating film such as a gate insulating film, the second reaction chamber 300b is used for forming a microcrystalline semiconductor layer which forms a channel, and the third reaction chamber 300c is used for forming a semiconductor film including an impurity element imparting one conductivity type, which serves as a source and a drain. Needless to say, the number of reaction chambers is not limited to three and may be increased or decreased as necessary. Moreover, one reaction chamber may be used for forming one film or a plurality of films.

Each reaction chamber is connected to a turbomolecular pump 319 and a dry pump 320 as an evacuation means. The evacuation means is not limited to the combination of these vacuum pumps, and may be another vacuum pump as long as the evacuation can be performed to attain a vacuum degree of about $10^{-1}$ Pa to $10^{-5}$ Pa. The second reaction chamber 300b used for forming the microcrystalline semiconductor film is connected to the cryopump 321 which evacuates until ultra-high vacuum is attained. A butterfly valve 317 is provided between the evacuation means and each reaction chamber to block vacuum evacuation. With a conductance valve 318, the evacuation speed is controlled to adjust the pressure in each reaction chamber.

The gas supplying means 308 includes the cylinder 310 which is filled with gas used in the process, such as a semiconductor material gas or a rare gas, the stop valve 312, the mass flow controller 313, and the like. A gas supplying means 308g is connected to the first reaction chamber 300a to supply a gas for forming a gate insulating film. A gas supplying means 308i is connected to the second reaction chamber 300b to supply a gas for forming a microcrystalline semiconductor film. A gas supplying means 308n is connected to the third reaction chamber 300c to supply a gas for forming, for example, an n-type semiconductor film. A gas supplying means 308a supplies argon and a gas supplying means 308f supplies an etching gas used for cleaning the inside of the reaction chambers. The both means 308a and 308f are connected to all of the reaction chambers.

Each reaction chamber is connected to a high-frequency electric power supplying means for generating plasma. The high-frequency electric power supplying means 303 includes a high-frequency power source and a matching box. In this case, similar to Embodiment Mode 2, the first high-frequency power source 304 and the second high-frequency power source 305, and the first matching box 306 and the second matching box 307 are provided to form a thin film with favorable homogeneity. A thin film with favorable homogeneity can be formed over a substrate of any size when the plasma CVD apparatus has a structure that is suitable for the size of various kinds of glass substrates (such as 300 mm×400 mm called the first generation, 550 mm×650 mm called the third generation, 730 mm×920 mm called the fourth generation, 1000 mm×1200 mm called the fifth generation, 2450 mm×1850 mm called the sixth generation, 1870 mm×2200 mm called the seventh generation, 2000 mm×2400 mm called the eighth generation, 2450 mm×3050 mm called the ninth generation, 2850 mm×3050 mm called the tenth generation, and so on).

As shown in this embodiment mode, a plurality of different layers can be stacked successively without being exposed to the air with the use of the plurality of reaction chambers connected to the common chamber shown in FIG. 18.

This embodiment mode can be implemented in combination with any of structures or manufacturing methods described in other embodiment modes.

Embodiment Mode 4

In this embodiment mode, a method of manufacturing a display device having a thin film transistor, which is different from that in the above embodiment mode, is described with reference to drawings. Specifically, a manufacturing method using a multitone mask is described.

Figure 8A:
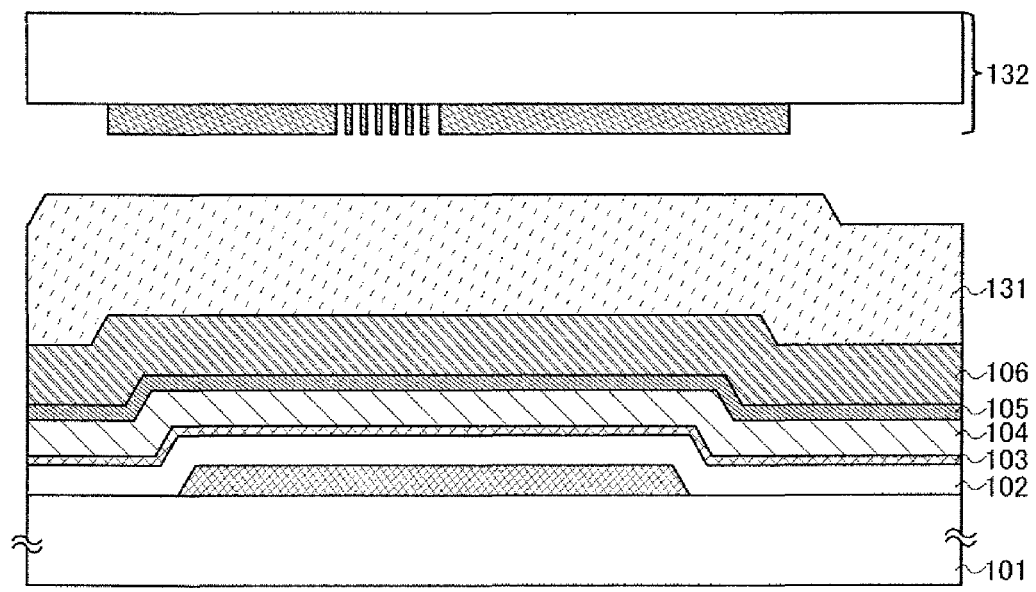
FIGS. 8A and 8B show an example of a method of manufacturing a display device of the present invention.

First, the gate electrode 101, the gate insulating film 102, the microcrystalline semiconductor film 103 having a microcrystalline structure, the amorphous semiconductor film 104 functioning as a buffer layer, the third semiconductor film 105 with an impurity element imparting one conductivity type added, and the conductive film 106 are sequentially stacked over the substrate 100, and then a resist 131 is formed over the conductive film 106. Next, the resist 131 is exposed to light by using a multitone mask 132 (see FIG. 8A).

The resist 131 may be a positive resist or a negative resist. Here, a positive resist is used as the resist 131.

Light exposure using the multitone mask 132 is described here with reference to FIGS. 15A to 15D.

The multitone mask is capable of light exposure at three levels to provide a light-exposed portion, a half-light-exposed portion, and a non-light-exposed portion. Through a step of light exposure and development, a resist mask including regions with plural thicknesses (typically, two kinds) can be formed. Accordingly, the number of photomasks can be reduced by using the multitone mask.

Figure 15A:
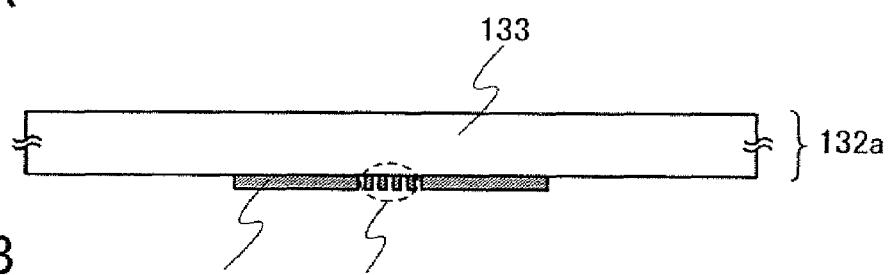
FIGS. 15A to 15D show an example of a method of manufacturing a display device of the present invention.
Figure 15B:
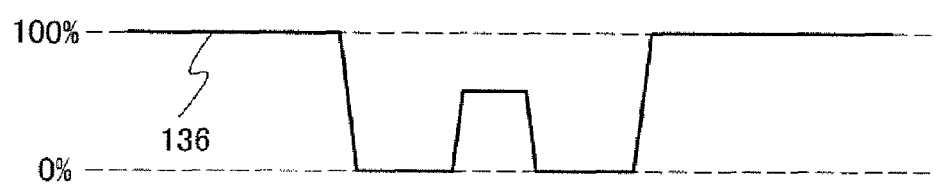
Figure 15C:
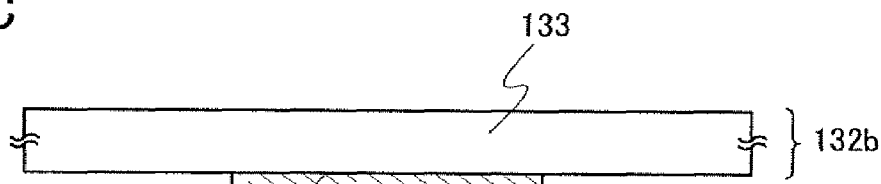
Figure 15D:
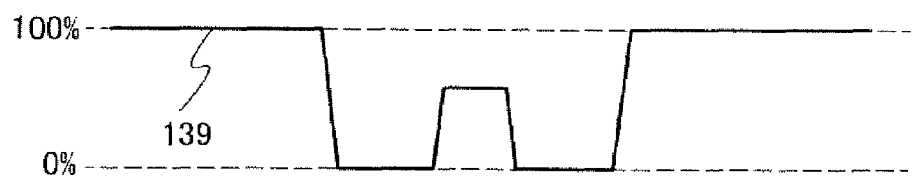

Typical examples of the multitone mask include a graytone mask 132a shown in FIG. 15A and a halftone mask 132b shown in FIG. 15C.

The graytone mask 132a is formed by a light-transmitting substrate 133, and a light-blocking portion 134 and a diffraction grating 135 which are formed on the substrate 133, as shown in FIG. 15A. The light-blocking portion 134 has a light transmittance of 0%. On the other hand, the diffraction grating 135 can control the amount of light that transmits therethrough in such a way that the interval of light-transmitting portions such as slits, dots, or meshes is set at or below the resolution limit of light used for the light exposure. It is to be noted that periodic slits, dots, or meshes, or aperiodic slits, dots, or meshes can be used as the diffraction grating 135.

The light-transmitting substrate 133 may be a quartz substrate or the like that transmits light. The light-blocking portion 134 and the diffraction grating 135 can be formed of a light-blocking material that absorbs light, such as chromium or chromium oxide.

In a case of irradiating the graytone mask 132a with exposure light, a light transmittance 136 of the light-blocking portion 134 is 0% while that of regions without the light-blocking portion 134 and the diffraction grating 135 is 100%. The diffraction grating 135 can adjust the light transmittance in the range of 10 to 70% inclusive by adjusting the interval or pitch of the slits, dots, or meshes of the diffraction grating 135.

The halftone mask 132b is formed by the light-transmitting substrate 133, and a half-light-transmitting portion 137 and a light-blocking portion which are formed on the substrate 133, as shown in FIG. 15C. The half-light-transmitting portion 137 can be formed of MoSiN, MoSi, MoSiO, MoSiON, CrSi, or the like. The light-blocking portion 138 can be formed of a light-blocking material that absorbs light, such as chromium or chromium oxide.

In a case of irradiating the halftone mask 132b with exposure light, a light transmittance 139 of the light-blocking portion 138 is 0% while that of regions without the light-blocking portion 138 and the half-light-transmitting portion 137 is 100%. The half-light-transmitting portion 137 can adjust the light transmittance in the range of 10 to 70% inclusive by adjusting the material of the half-light-transmitting portion 137.

Figure 8B:
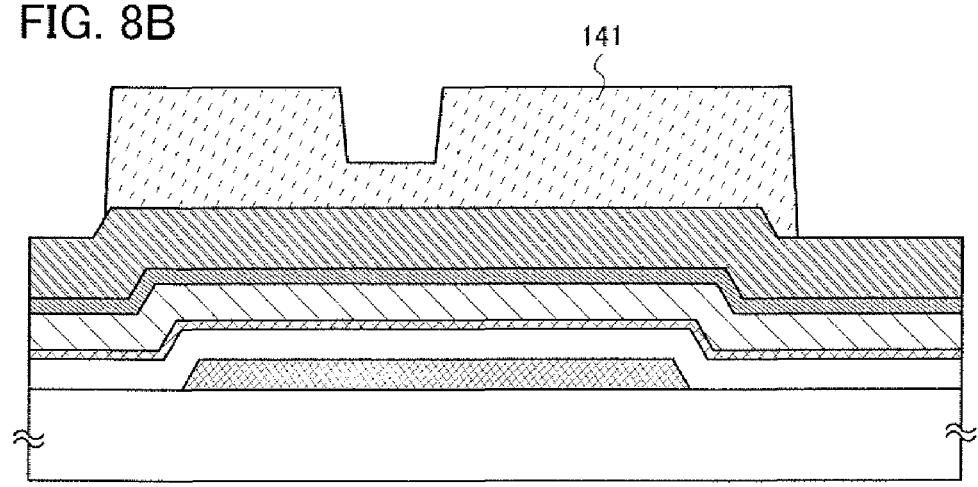

After the light exposure with the use of the multitone mask, development is performed. Thus, a resist mask 141 having regions with different film thicknesses can be formed as shown in FIG. 8B.

Figure 9A:
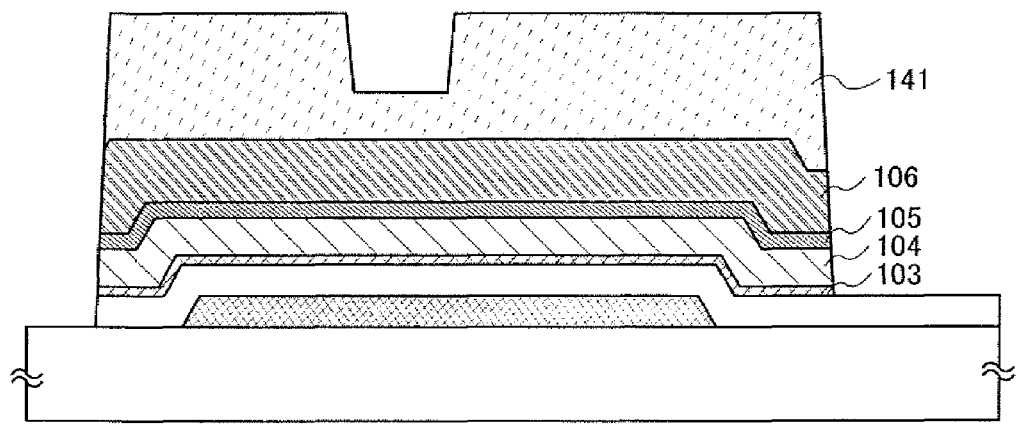
FIGS. 9A to 9C show an example of a method of manufacturing a display device of the present invention.

Next, the microcrystalline semiconductor film 103, the amorphous semiconductor film 104 functioning as a buffer layer, the third semiconductor film 105 with an impurity element imparting one conductivity type added, and the conductive film 106 are etched to be isolated by using the resist mask 141 (see FIG. 9A).

Figure 9B:
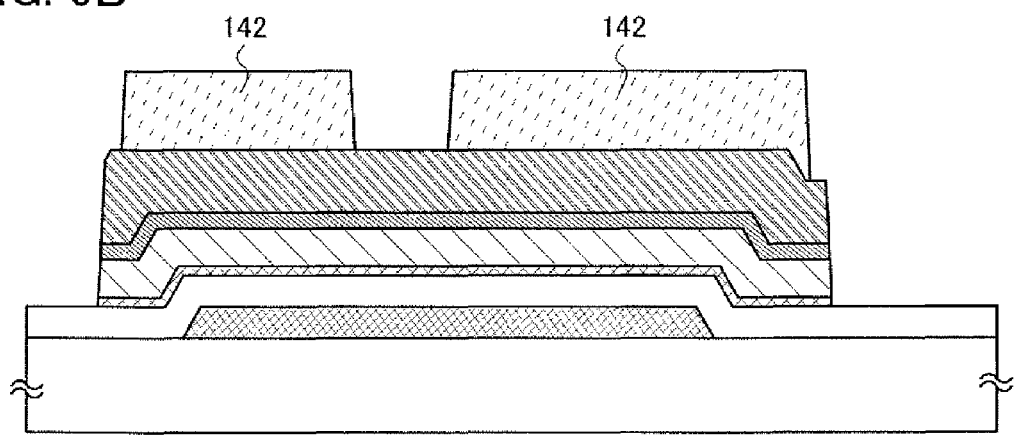

Then, the resist mask 141 is subjected to ashing. As a result, the area of the resist is reduced, and the thickness thereof is also decreased. At this time, a thin region of the resist (a region thereof that overlaps with a part of the gate electrode 101) is removed, whereby the resist 141 is divided into resist masks 142 as shown in FIG. 9B.

Figure 9C:
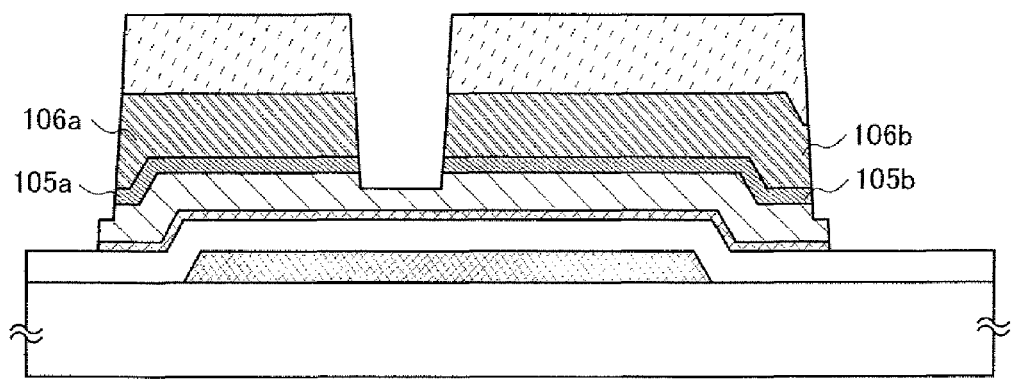

Subsequently, the semiconductor film 105 with an impurity element imparting one conductivity type added and the amorphous semiconductor film 104 functioning as a buffer layer are etched by using the resists 142, whereby the source region 105a and the drain region 105b, and the source electrode 106a and the drain electrode 106b are formed (see FIG. 9C). It is to be noted that the amorphous semiconductor film 104 functioning as a buffer layer is the one partly etched, and covers the surface of the microcrystalline semiconductor film 103. Here, a dent is formed at the surface of the amorphous semiconductor film 104 between the source region 105a and the drain region 105b.

Figure 10:
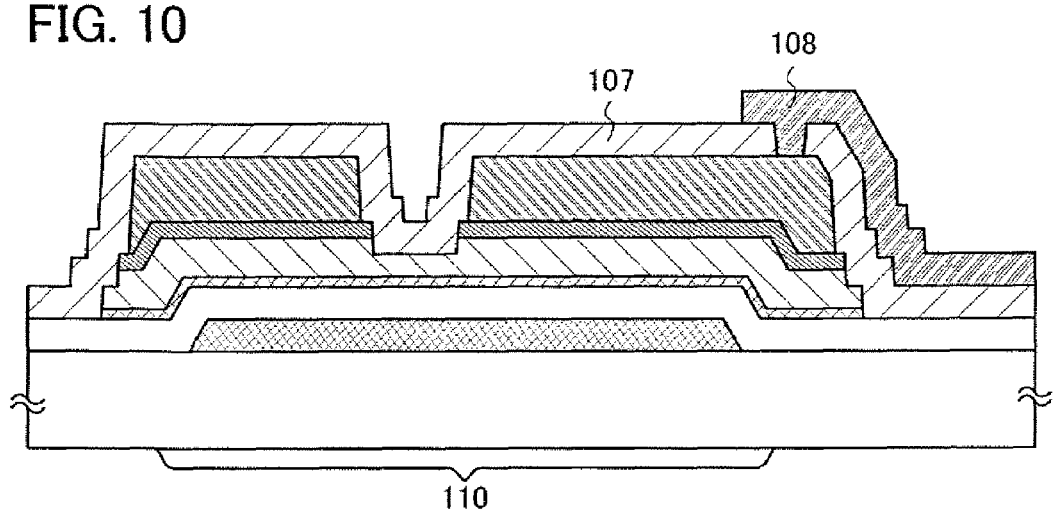
FIG. 10 shows an example of a method of manufacturing a display device of the present invention.

Next, the insulating film 107 is formed over the source electrode 106a and the drain electrode 106b, the source region 105a and the drain region 105b, the amorphous semiconductor film 104, and the gate insulating film 102. Subsequently, a contact hole is formed in the insulating film 107, and the pixel electrode 108 in contact with the drain electrode 106b through the contact hole is formed (see FIG. 10).

Through the aforementioned steps, a display device having the thin film transistor 110 in the pixel portion can be formed.

This embodiment mode can be implemented in combination with any of structures or manufacturing methods described in other embodiment modes.

Embodiment Mode 5

Figure 16A:
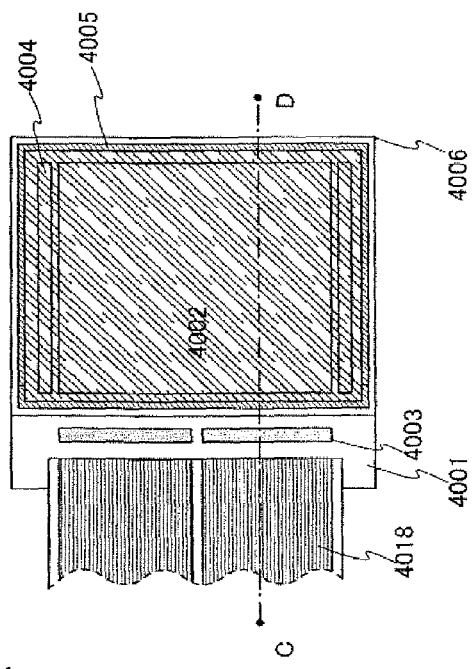
FIGS. 16A and 16B show an example of a usage mode of a display device of the present invention.
Figure 16B:
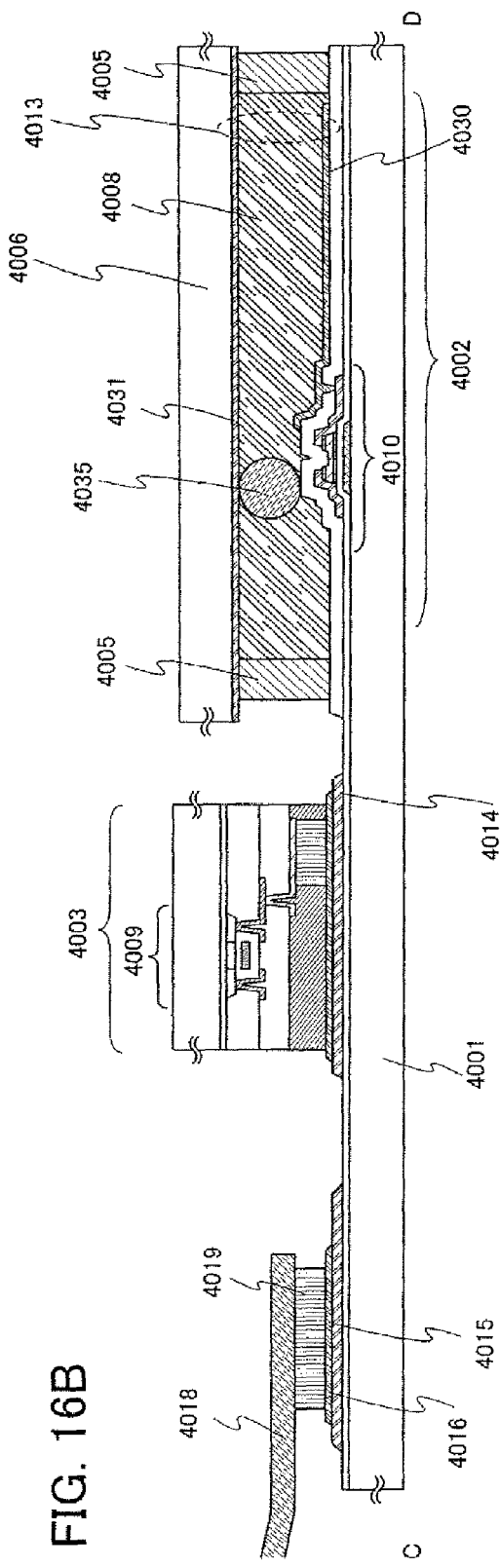

In this embodiment mode, a liquid crystal display panel as one mode of the display device shown in the above embodiment mode is described with reference to FIGS. 16A and 16B. FIG. 16A is a top view of a panel in which a thin film transistor 4010 and a liquid crystal element 4013 formed over a first substrate 4001 are sealed between the first substrate 4001 and a second substrate 4006 by a sealant 4005. FIG. 16B is a cross-sectional view along C-D of FIG. 16A.

The liquid crystal display panel shown in this embodiment mode includes the sealant 4005 by which a pixel portion 4002 and a scanning line driving circuit 4004 which are provided over the first substrate 4001 are surrounded. Moreover, the second substrate 4006 is provided over the pixel portion 4002 and the scanning line driving circuit 4004. Therefore, the pixel portion 4002 and the scanning line driving circuit 4004 are sealed together with a liquid crystal 4008 by the first substrate 4001, the sealant 4005, and the second substrate 4006.

A signal line driving circuit 4003 provided with a thin film transistor 4009 formed of a polycrystalline semiconductor film over another substrate is mounted in a region different from the region surrounded by the sealant 4005 over the first substrate 4001. It is to be noted that this embodiment mode shows the example in which the signal line driving circuit 4003 having the thin film transistor 4009 formed of a polycrystalline semiconductor film is attached to the first substrate 4001; however, the signal line driving circuit 4003 may be formed by a transistor formed of a single-crystal semiconductor and attached.

The pixel portion 4002 and the scanning line driving circuit 4004 provided over the first substrate 4001 both include a plurality of thin film transistors, and FIG. 16B shows, as an example, a thin film transistor 4010 included in the pixel portion 4002. The thin film transistor 4010 corresponds to the thin film transistor shown in Embodiment Modes 1 and 2. Moreover, the thin film transistors in the scanning line driving circuit 4004 can be provided to have a similar structure to that of the thin film transistor 4010.

A pixel electrode 4030 is electrically connected to the thin film transistor 4010. A counter electrode 4031 in the liquid crystal element 4013 is formed over the second substrate 4006. A portion where the pixel electrode 4030, the counter electrode 4031, and the liquid crystal 4008 overlap with each other corresponds to the liquid crystal element 4013.

The first substrate 4001 and the second substrate 4006 may each be formed of glass, metal (typically stainless steel), ceramics, or plastics. As for plastic, an FRP (fiberglass-reinforced plastics) plate, a PVF (polyvinyl fluoride) film, a polyester film, or an acrylic resin film can be used. In addition, a sheet with a structure in which an aluminum foil is sandwiched between PVF films or polyester films can be used.

A spherical spacer 4035 is provided to control a distance (a cell gap) between the pixel electrode 4030 and the counter electrode 4031. The spherical spacer 4035 may be replaced by a spacer obtained by selectively etching an insulating film.

A variety of signals and potential are supplied to the signal line driving circuit 4003 which is formed separately, the scanning line driving circuit 4004, or the pixel portion 4002 via leading wirings 4014 and 4015 from an FPC 4018.

In this embodiment mode, a connection terminal 4016 is formed of the same conductive film as that of the pixel electrode 4030. The leading wirings 4014 and 4015 are formed by the same conductive film as a source electrode and a drain electrode of the thin film transistor 4010.

The connection terminal 4016 is electrically connected to a terminal of an FPC 4018 via an anisotropic conductive film 4019.

Although not shown, the liquid crystal display device shown in this embodiment mode includes an orientation film, a polarizing plate, and further, may include a color filter and a shielding film.

Note that FIGS. 16A and 16B illustrate an example in which the signal line driving circuit 4003 is formed separately and mounted on the first substrate 4001; however, the present invention is not limited to this structure. The scanning line driving circuit may be separately formed and then mounted, or only a part of the signal line driving circuit or a part of the scanning line driving circuit may be separately formed and then mounted.

The liquid crystal display device described in this embodiment mode can be of TN (twisted nematic) type or VA (vertical alignment) type, or of horizontal electric field type.

The VA-type of a liquid crystal display device refers to one kind of methods for controlling alignment of liquid crystal molecules of a liquid crystal panel. In the VA-type liquid crystal display device, liquid crystal molecules are aligned in a direction perpendicular to a panel surface when no voltage is applied. In this embodiment mode, a devise has been made in which pixels are divided into some regions (sub-pixels) so that molecules in each region are aligned in different directions. This is referred to as multi-domain or multi-domain design.

The horizontal electric field method is a method in which an electric field is applied to liquid crystal molecules in a cell in a horizontal direction, whereby liquid crystals are driven to express gray scales. In accordance with this method, a viewing angle can be expanded up to approximately 180°.

This embodiment mode can be implemented in combination with any of structures or manufacturing methods described in other embodiment modes.

Embodiment Mode 6

Figure 17A:
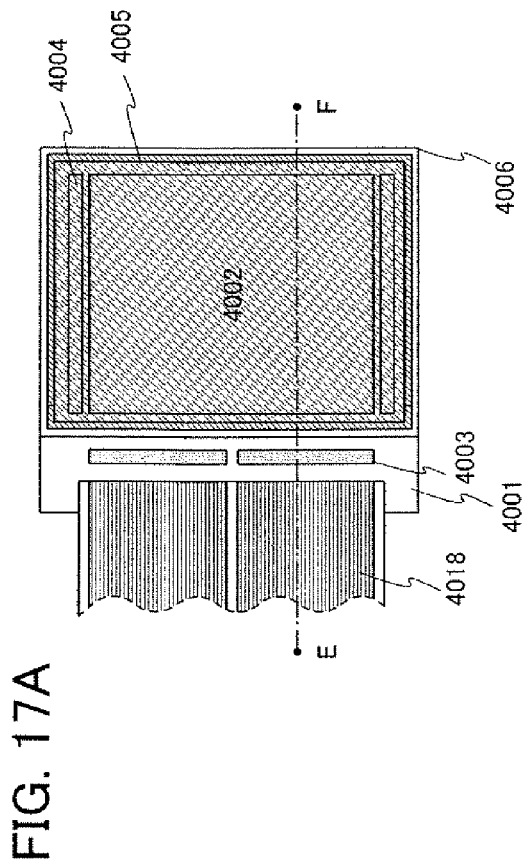
FIGS. 17A and 17B show an example of a usage mode of a display device of the present invention.
Figure 17B:
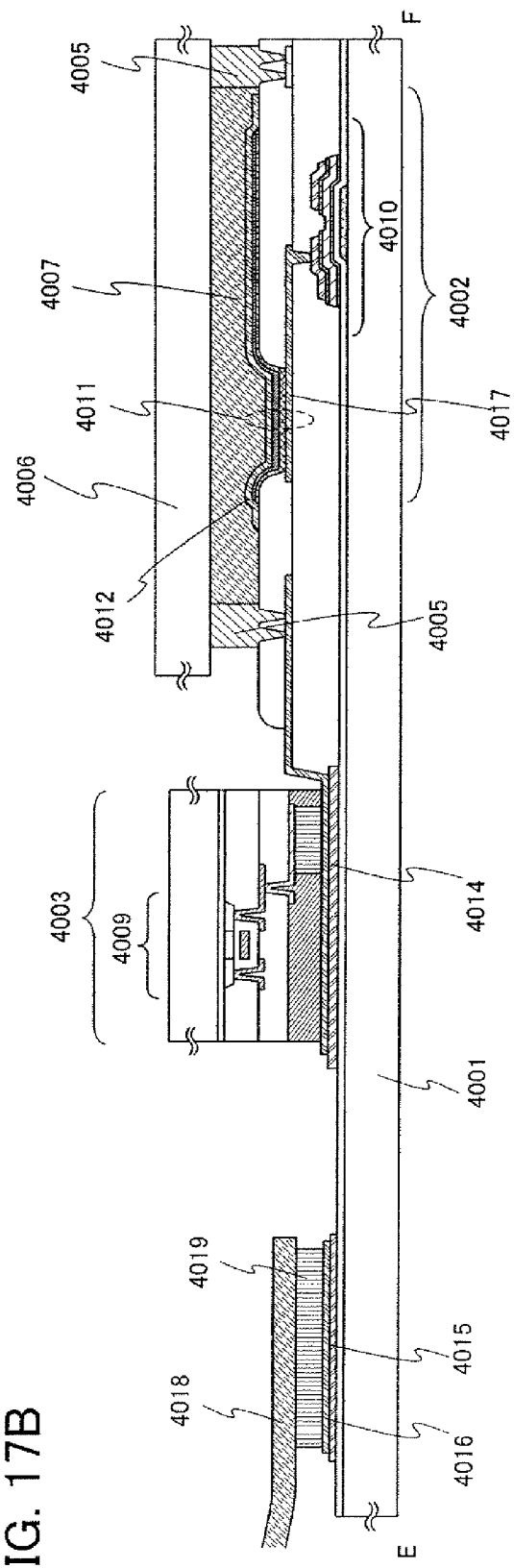

This embodiment mode describes a light-emitting display panel as one mode of the display device shown in the above embodiment mode, with reference to FIGS. 17A and 17B. FIG. 17A is a top view of a panel in which the thin film transistor 4010 and a light-emitting element 4011 formed over the first substrate 4001 are sealed by the sealant 4005 between the first substrate 4001 and the second substrate 4006. FIG. 17B is a cross-sectional view along E-F of FIG. 17A.

In this embodiment mode, a light-emitting element utilizing electroluminescence is shown. Light emitting elements utilizing electroluminescence are classified according to whether a light emitting material is an organic compound or an inorganic compound. In general, the former is referred to as an organic EL element, the latter as an inorganic EL element.

In the light-emitting display panel shown in this embodiment mode, the sealant 4005 is provided so as to surround the pixel portion 4002 and the scanning line driving circuit 4004 which are provided over the first substrate 4001. Moreover, the second substrate 4006 is provided over the pixel portion 4002 and the scanning line driving circuit 4004. Therefore, the pixel portion 4002 and the scanning line driving circuit 4004 are sealed together with a filter 4007 by the first substrate 4001, the sealant 4005, and the second substrate 4006.

The signal line driving circuit 4003 provided with the thin film transistor 4009 formed of a polycrystalline semiconductor film over another substrate is mounted in a region different from the region surrounded by the sealant 4005 over the first substrate 4001. It is to be noted that this embodiment mode shows the example in which the signal line driving circuit 4003 having the thin film transistor 4009 formed of a polycrystalline semiconductor film is attached to the first substrate 4001; however, the signal line driving circuit 4003 may be formed by a transistor formed of a single-crystal semiconductor and then attached.

The pixel portion 4002 and the scanning line driving circuit 4004 provided over the first substrate 4901 both include a plurality of thin film transistors, and FIG. 17B shows, as an example, the thin film transistor 4010 included in the pixel portion 4002. The thin film transistor 4010 corresponds to the thin film transistor shown in Embodiment Modes 1 and 2. Moreover, each of the transistors in the scanning line driving circuit 4004 can be provided to have a similar structure to the thin film transistor 4010.

A pixel electrode 4017 of the light-emitting element 4011 is electrically connected to a source electrode or a drain electrode of the thin film transistor 4010. The structure of the light-emitting element 4011 can be changed as appropriate in accordance with a direction in which light is extracted from the light-emitting element 4011, the polarity of the thin film transistor 4010, and the like.

Although a variety of signals and potential which are applied to the signal line driving circuit 4003 formed separately, the scanning line driving circuit 4004, or the pixel portion 4002 are not illustrated in the cross-sectional view of FIG. 17B, the variety of signals and the potential are supplied from the FPC 4018 through the leading wirings 4014 and 4015.

In this embodiment mode, the connection terminal 4016 is formed by the same conductive film as the pixel electrode 4017 of the light-emitting element 4011. The leading wirings 4014 and 4015 are formed by the same conductive film as the source electrode and the drain electrode of the thin film transistor 4010.

The connection terminal 4016 is electrically connected to a terminal of the FPC 4018 via the anisotropic conductive film 4019.

The substrate through which light from the light-emitting element 4011 is extracted is made of a light-transmitting material. In this embodiment mode, the second substrate 4006 is made of a light-transmitting material such as a glass plate, a plastic plate, a polyester film, or an acrylic film so that light can be extracted from the second substrate 4006 side.

An ultraviolet curable resin or a thermosetting resin as well as an inert gas such as nitrogen or argon can be used as the filler 4007. PVC (polyvinyl chloride), acrylic, polyimide, an epoxy resin, a silicone resin, PVB (polyvinyl butyral), or EVA (ethylene vinyl acetate) can be used.

In addition, if needed, an optical film such as a polarizing plate, a circularly polarizing plate (including an elliptically polarizing plate), a retardation plate (a quarter-wave plate, a half-wave plate), a color filter, or the like may be provided on a projection surface of the light-emitting element, as appropriate. Further, a polarizing plate or a circularly polarizing plate may be provided with an anti-reflection film. For example, anti-glare treatment by which reflected light can be dispersed on an uneven surface to reduce glare can be performed.

Note that FIGS. 17A and 17B illustrate an example in which the signal line driving circuit 4003 is formed separately and mounted to the first substrate 4001; however, this embodiment mode is not limited to this structure. The scanning line driving circuit may be separately formed and then mounted; alternatively, only a part of the signal line driving circuit or a part of the scanning line driving circuit may be separately formed and then mounted.

This embodiment mode can be implemented in combination with any of structures or manufacturing methods described in other embodiment modes.

Embodiment Mode 7

With the display device obtained by the present invention, an active matrix display device module can be completed. That is, the present invention can be applied to all electronic devices incorporating the display devices in display portions. As those kinds of electronic devices, cameras such as video cameras and digital cameras, head-mounted displays (goggle-type displays), car navigation systems, projectors, car stereos, personal computers, portable information terminals (such as mobile computers, cellular phones, and electronic book readers), and the like can be given. Examples of these devices are illustrated in FIGS. 13A to 13D.

FIG. 13A illustrates a television device. A television device can be completed by incorporation of a display module into a housing as illustrated in FIG. 13A. A display panel including components up to an FPC is also referred to as a display module. A main screen 2003 is formed by using the display module, and speaker portions 2009, an operation switch, and the like are provided as its accessory equipment. In such a manner, a television device can be completed.

As illustrated in FIG. 13A, a display panel 2002 using display elements is incorporated into a housing 2001. In addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. The television device can be operated by switches incorporated in the housing or by a remote controller 2006 separated from the main body. A display portion 2007 that displays information to be output may also be provided in this remote controller.

In addition to the main screen 2003, the television device may include a sub-screen 2008 formed using a second display panel to display channels, volume, or the like. In this structure, the main screen 2003 may be formed by a liquid crystal display panel which has an excellent viewing angle, and the sub-screen 2008 may be formed by a light-emitting display panel by which display at low power consumption is possible. In addition, in order to give priority to reduction of power consumption, the structure may be set so that the main screen 2003 is formed by a light-emitting display panel and the sub-screen 2008 is formed by a light-emitting display panel, and the sub-screen 2008 is capable of being turned on or off.

Figure 14:
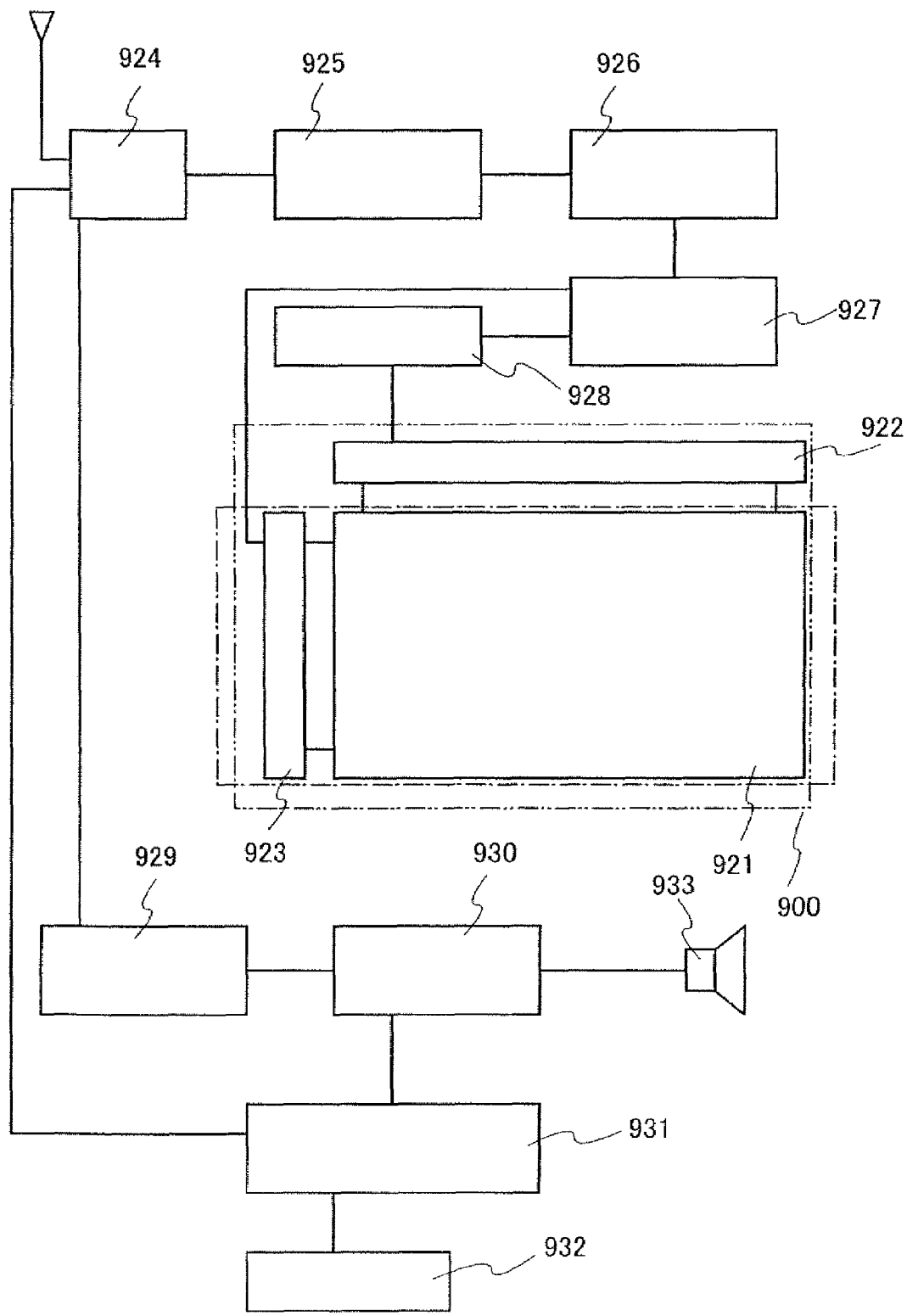
FIG. 14 shows an example of a usage mode of a display device of the present invention.

FIG. 14 is a block diagram showing a main structure of the television device. A pixel portion 921 is formed in a display panel 900. A signal line driving circuit 922 and a scanning line driving circuit 923 may be mounted to the display panel 900 by a COG method.

As another external circuit, a video signal amplifier circuit 925 which amplifies a video signal among signals received by a tuner 924; a video signal processing circuit 926 which converts the signals output from the video signal amplifier circuit 925 into chrominance signals corresponding to red, green, and blue colors; a control circuit 927 which converts the video signal in accordance with an input specification of the driver IC; and the like are provided on an input side of the video signal. The control circuit 927 outputs signals to both a scan line side and a signal line side. In a case of digital driving, a signal dividing circuit 928 may be provided on the signal line side, and an input digital signal may be divided into m number of parts and then supplied.

An audio signal among the signals received by the tuner 924 is sent to an audio signal amplifier circuit 929, and its output is supplied to a speaker 933 via an audio signal processing circuit 930. A control circuit 931 receives control information about a receiving station (reception frequency) or sound volume from an input portion 932 and transmits signals to the tuner 924 or the audio signal processing circuit 930.

As a matter of course, the present invention is not limited to the television device. The present invention can be used in a variety of applications such as monitors of personal computers and large-area display media such as information display boards at train stations, airports, or the like, and advertising display boards on the streets.

FIG. 13B illustrates one mode of a cellular phone 2301. The cellular phone 2301 includes a display portion 2302, operation switches 2303, and the like. The display device described in the preceding embodiment modes is applied to the display portion 2302, so that mass productivity can be improved.

In addition, a portable computer illustrated in FIG. 13C includes a main body 2401, a display portion 2402, and the like. The display device described in the preceding embodiment modes is applied to the display portion 2402, so that mass productivity can be improved.

FIG. 13D illustrates a desktop lighting appliance including a lighting portion 2501, a shade 2502, an adjustable arm 2503, a support 2504, a base 2505, and a power source 2506. The desktop lighting appliance is manufactured by using the light-emitting device of the present invention in the lighting portion 2501. Note that the lighting appliance includes a ceiling light, a wall light, and the like. By applying the display device shown in the above embodiment mode, the mass productivity can be enhanced and an inexpensive desktop lighting appliance can be provided.

This application is based on Japanese Patent Application serial no. 2007-212904 filed with Japan Patent Office on Aug. 17, 2007 and Japanese Patent Application serial no. 2007-212903 filed with Japan Patent Office on Aug. 17, 2007, the entire contents of which are hereby incorporated by reference.

What is claimed is:

1. A method of manufacturing a display device, comprising:
    forming a gate electrode over a substrate;
    forming a gate insulating film over the gate electrode;
    forming a microcrystalline semiconductor film over the gate insulating film by a plasma CVD method; and
    forming an amorphous semiconductor film over the microcrystalline semiconductor film,
    wherein the step of forming the microcrystalline semiconductor film comprises:
        a pressure of a reaction chamber being set at or below $10^{-5}$ Pa;
        a temperature of the substrate being set in a range of 100° C. to 200° C.;
        plasma being produced by introducing hydrogen and a rare gas; and
        hydrogen plasma being made to act on a reaction product formed on a surface of the gate insulating film to etch the reaction product while forming the microcrystalline semiconductor film.

2. The method of manufacturing a display device according to claim 1,
wherein the microcrystalline semiconductor film has an oxygen concentration of $1\times10^{17}$ atoms/cm$^3$ or less.

3. The method of manufacturing a display device according to claim 1,
wherein trimethylboron is introduced in the microcrystalline semiconductor film so that an i-type or p-type microcrystalline semiconductor film is formed.

4. The method of manufacturing a display device according to claim 1,
wherein the amorphous semiconductor film is formed over the microcrystalline semiconductor film without exposure of a surface of the microcrystalline semiconductor film to the air.

5. A method of manufacturing a display device, comprising:
forming a gate electrode over a substrate;
forming a gate insulating film over the gate electrode;
forming a microcrystalline semiconductor film over the gate insulating film by a plasma CVD method; and
forming an amorphous semiconductor film over the microcrystalline semiconductor film,
wherein the step of forming the microcrystalline semiconductor film comprises:
a pressure of a reaction chamber being set at or below $10^{-5}$ Pa;
a temperature of the substrate being set in a range of 100° C. to 200° C.;
plasma being produced by introducing hydrogen and a rare gas; and
hydrogen plasma and rare gas plasma are made to act on a reaction product formed on a surface of the gate insulating film to etch the reaction product while forming the microcrystalline semiconductor film by introducing a silicon gas.

6. The method of manufacturing a display device according to claim 5,
wherein the microcrystalline semiconductor film has an oxygen concentration of $1\times10^{17}$ atoms/cm$^3$ or less.

7. The method of manufacturing a display device according to claim 5,
wherein trimethylboron is introduced in the microcrystalline semiconductor film so that an i-type or p-type microcrystalline semiconductor film is formed.

8. The method of manufacturing a display device according to claim 5,
wherein the amorphous semiconductor film is formed over the microcrystalline semiconductor film without exposure of a surface of the microcrystalline semiconductor film to the air.

9. The method of manufacturing a display device according to claim 5,
wherein the introduction of the rare gas is stopped before the introduction of the silicon gas.

10. The method of manufacturing a display device according to claim 5,
wherein the introduction of the rare gas is stopped after the introduction of the silicon gas,
wherein a predetermined period is interposed between the introduction of the silicon gas and the stop of the rare gas.

11. The method of manufacturing a display device according to claim 5,
wherein argon is used as the rare gas.

12. A method of manufacturing a display device, comprising:
forming a gate electrode over a substrate;
forming a gate insulating film over the gate electrode;
forming a microcrystalline semiconductor film over the gate insulating film by a plasma CVD method; and
forming an amorphous semiconductor film over the microcrystalline semiconductor film,
wherein the step of forming the microcrystalline semiconductor film comprises:
a pressure of a reaction chamber being set at or below $10^{-5}$ Pa;
a temperature of the substrate being set in a range of 100° C. to 200° C.;
plasma being generated by introducing hydrogen and a silicon gas and applying a first high-frequency electric power of an HF band and a second high-frequency electric power of a VHF band superimposed on each other; and
hydrogen plasma being made to act on a reaction product formed on a surface of the gate insulating film to etch the reaction product while forming the microcrystalline semiconductor film.

13. The method of manufacturing a display device according to claim 12,
wherein the microcrystalline semiconductor film has an oxygen concentration of $1\times10^{17}$ atoms/cm$^3$ or less.

14. The method of manufacturing a display device according to claim 12,
wherein trimethylboron is introduced in the microcrystalline semiconductor film so that an i-type or p-type microcrystalline semiconductor film is formed.

15. The method of manufacturing a display device according to claim 12,
wherein the amorphous semiconductor film is formed over the microcrystalline semiconductor film without exposure of a surface of the microcrystalline semiconductor film to the air.

16. A method of manufacturing a display device, comprising:
forming a gate electrode over a substrate;
forming a gate insulating film over the gate electrode;
forming a microcrystalline semiconductor film over the gate insulating film by a plasma CVD method; and
forming an amorphous semiconductor film over the microcrystalline semiconductor film,
wherein the step of forming the microcrystalline semiconductor film comprises:
a pressure of a reaction chamber being set at or below $10^{-5}$ Pa;
a temperature of the substrate being set in a range of 100° C. to 200° C.;
plasma being generated by introducing hydrogen and a rare gas and applying a first high-frequency electric power of an HF band and a second high-frequency electric power of a VHF band superimposed on each other; and
hydrogen plasma and rare gas plasma being made to act on a reaction product formed on a surface of the gate insulating film to etch the reaction product while forming the microcrystalline semiconductor film by introducing a silicon gas.

17. The method of manufacturing a display device according to claim 16,
wherein the microcrystalline semiconductor film has an oxygen concentration of $1\times10^{17}$ atoms/cm$^3$ or less.

18. The method of manufacturing a display device according to claim 16, wherein trimethylboron is introduced in the microcrystalline semiconductor film so that an i-type or p-type microcrystalline semiconductor film is formed.

19. The method of manufacturing a display device according to claim 16,
wherein the amorphous semiconductor film is formed over the microcrystalline semiconductor film without exposure of a surface of the microcrystalline semiconductor film to the air.

20. The method of manufacturing a display device according to claim 16,
wherein the introduction of the rare gas is stopped before the introduction of the silicon gas.

21. The method of manufacturing a display device according to claim 16,
wherein the introduction of the rare gas is stopped after the introduction of the silicon gas,
wherein a predetermined period is interposed between the introduction of the silicon gas and the stop of the rare gas.

22. The method of manufacturing a display device according to claim 16,
wherein argon is used as the rare gas.

* * * * *